United States Patent
Harada et al.

(10) Patent No.: US 8,273,657 B2
(45) Date of Patent: Sep. 25, 2012

(54) METHOD FOR MANUFACTURING A SEMICONDUCTOR APPARATUS HAVING A THROUGH-HOLE INTERCONNECTION

(75) Inventors: Yoshimichi Harada, Kanagawa (JP); Masami Suzuki, Tokyo (JP); Yoshihiro Nabe, Tokyo (JP); Yuji Takaoka, Kanagawa (JP); Tatsuo Suemasu, Shizuoka (JP); Hideyuki Wada, Chiba (JP); Masanobu Saruta, Chiba (JP)

(73) Assignees: Sony Corporation, Tokyo (JP); Fujikura Ltd., Tokyo (JP)

( * ) Notice: Subject to any disclaimer, the term of this patent is extended or adjusted under 35 U.S.C. 154(b) by 0 days.

(21) Appl. No.: 13/027,614

(22) Filed: Feb. 15, 2011

(65) Prior Publication Data

US 2011/0136342 A1 Jun. 9, 2011

Related U.S. Application Data

(62) Division of application No. 12/348,988, filed on Jan. 6, 2009.

(30) Foreign Application Priority Data

Jan. 9, 2008 (JP) ................................. 2008-002553

(51) Int. Cl.
*H01L 21/44* (2006.01)
(52) U.S. Cl. ........ 438/667; 438/637; 438/638; 438/640; 257/621
(58) Field of Classification Search .......... 438/637–640, 438/667; 257/276, 502, 621, 774
See application file for complete search history.

(56) References Cited

U.S. PATENT DOCUMENTS

2006/0087042 A1* 4/2006 Kameyama et al. .......... 257/774
2006/0108695 A1* 5/2006 Kameyama et al. .......... 257/774

FOREIGN PATENT DOCUMENTS

JP 2004-165321 10/2004
JP 2006-128353 5/2006

* cited by examiner

*Primary Examiner* — Ori Nadav
(74) *Attorney, Agent, or Firm* — SNR Denton US LLP

(57) ABSTRACT

A method for manufacturing a semiconductor apparatus having a through-hole interconnection in a semiconductor substrate. An insulating layer is formed on the semiconductor substrate. A via hole is formed through the semiconductor substrate and the insulating layer. Another insulating layer is formed in the via hole, and a conductive layer of the through-hole interconnection is subsequently formed. The insulating layer formed in the via hole is formed such as to substantially planarize an inner surface of the via hole.

4 Claims, 18 Drawing Sheets

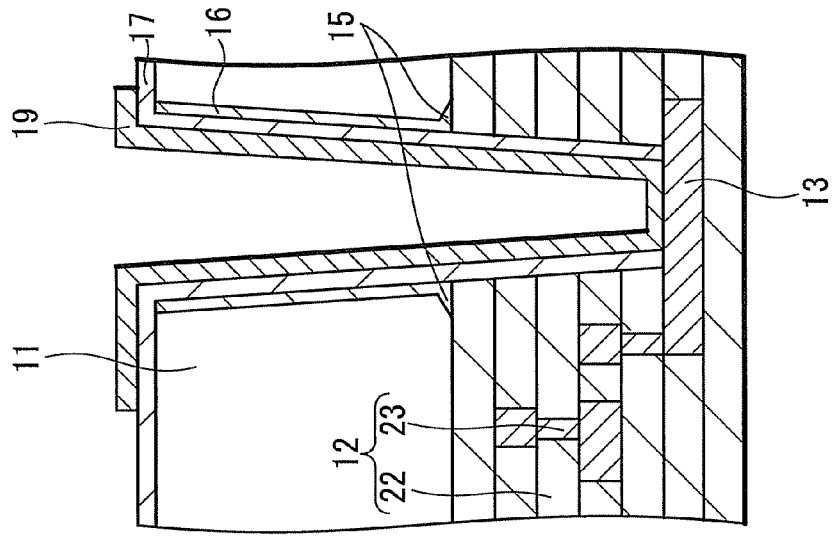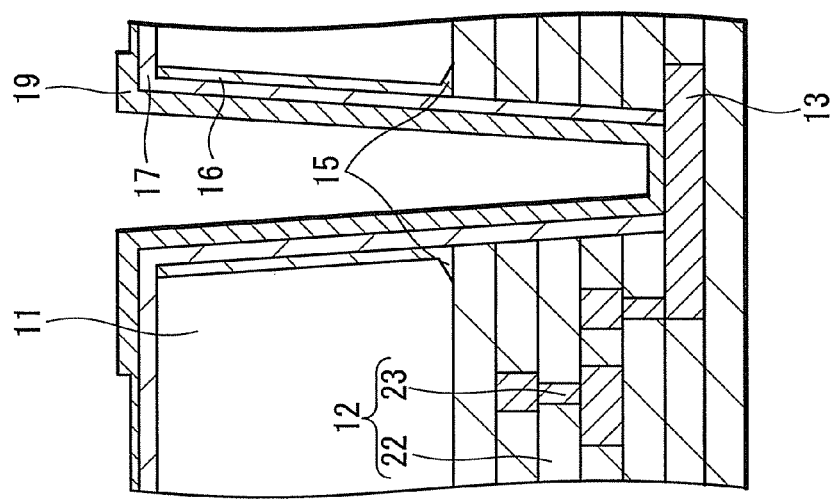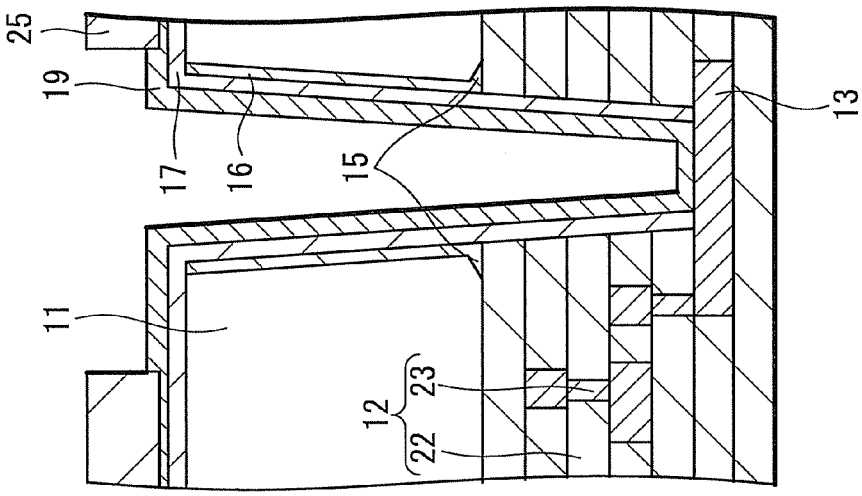

METHOD FOR MANUFACTURING A SEMICONDUCTOR APPARATUS HAVING A THROUGH-HOLE INTERCONNECTION

RELATED APPLICATION DATA

This application is a division of U.S. patent application Ser. No. 12/348,988, filed Jan. 6, 2009, the entirety of which is incorporated herein by reference to the extent permitted by law. The present application claims the benefit of priority to Japanese Patent Application No JP 2008-002553 filed in the Japanese Patent Office on Jan. 9, 2008, the entirety of which is incorporated by reference herein to the extent permitted by law.

BACKGROUND OF THE INVENTION

1. Field of the Invention:

The present invention relates to a semiconductor apparatus with a through-hole interconnection formed in a semiconductor chip and a method for manufacturing the same.

2. Description of the Related Art:

Heretofore, attention has been given to CSP (chip size package or chip scale package) structure as the miniaturized or thinned structures of semiconductor devices, such as LSIs.

Many of CSPs are provided as ball grid arrays (BGAs) in which balls such as those made of solder are arranged on the uppermost surface of an apparatus or land grid array (LGAs) in which a plurality of flat electrodes are arranged.

In addition, in the case of the CSP technology used in an image sensor, such as a CMOS (complementary metal oxide semiconductor) image sensor or a CCD (charge coupled device) image sensor, an electrode is placed on the backside of a substrate, or the side opposite to the image-sensor side. It is in contrast to the CSP in the past in which an electrode is placed on the principle surface of a substrate (the surface thereof on which an active element is formed).

Such a configuration realizes a miniaturized, thinned semiconductor apparatus to be used for an image sensor.

A ShellOP-type semiconductor, such as one shown in FIG. 1, has been known as a BGA-type CSP used for an image sensor (see, for example, Japanese Unexamined Patent Application Publication No. 2004-165312).

A semiconductor apparatus 100 shown in FIG. 1 has a stacked structure in which a semiconductor chip 109 is sealed with a first glass substrate 101 and a second glass substrate 105 with adhesive layers 104 and 107 made of resin or the like in between.

The semiconductor chip 109 includes a semiconductor substrate 111 and a wiring layer 110. The semiconductor substrate 111 is made of silicon or the like on which a transistor, a protective film, and the like, not shown in the figure, are formed. The wiring layer 110 is formed on the semiconductor substrate 111 and includes stacked layers of conductive layers and insulating layers. The conductive layers include wiring, pad electrodes, and the like. The insulating layers are insulating interlayers or the like that covers the conductive layers.

In addition, the semiconductor chip 109 is provided with a light-receiving/emitting element, a light-receiving/emitting sensor surface (not shown) and the like. In addition, a color filter and an on-chip lens (not shown) corresponding to the sensor surface are formed above the wiring layer 110.

Furthermore, in the semiconductor apparatus 100, the semiconductor chip 109 is connected to a rewiring layer 108 through a pad electrode in the wiring layer 110. Then, the semiconductor chip 109 is rewired by connecting the end of the rewiring layer 108 to the wiring layer 103 of the semiconductor apparatus 100.

In the semiconductor apparatus 100, the wiring layer 103 is formed from the boundary of the first glass substrate 101 and the adhesive layer 107, which are stacked on top of one another, to the lower part of the second glass substrate 105 through the lateral sides of the semiconductor chip 109, the adhesive layer 104, and the second glass substrate 105. Further, the wiring layer 103 is connected to an external terminal 106 of the semiconductor apparatus 100 at the lower part of the second glass substrate 105.

Furthermore, for example, a protective layer 102 made of an insulating resin such as a solder resist covers the whole surface, except the surface of the external terminals 106. A resin layer 112 is formed between the wiring layer 103 and the second glass substrate 105, at a position corresponding to the position where the external terminal 106 is formed. The resin layer 112 is a member for reducing the stress on the external terminal 106.

After the protective layer 102 is formed, the semiconductor apparatus 100 is separated into pieces in the direction shown by arrows C and C'. Therefore, cutting ends 113 of the wiring layer 103 are exposed without being covered with the protective layer 102. With the ends of the wiring layer 103 exposed on the lateral surface of the semiconductor apparatus 100, the wiring layer 103 may be corroded by reacting with moisture in the atmosphere. It may lead the semiconductor apparatus 100 unreliable in operation.

Furthermore, a part where the rewiring layer 108 and the wiring layer 103 are connected has a small contact area. Thus, contact resistance may increase and disconnection may occur, for example.

In addition to the aforementioned ShellOP-type semiconductor apparatus, a semiconductor apparatus having a different structure is used as an image sensor in the art, in which a through-hole interconnection is formed inside the cutting plane of a semiconductor substrate (see, for example, Japanese Unexamined Patent Application Publication No. 2006-128353 and Dzafir Shariff, et al., "Via Interconnections for Wafer Level Packaging: Impact Tapered Via Geometry on Product Yield and Reliability" 2007 Electronic Components and Technology Conference).

FIG. 2 is a cross-sectional view illustrating a through-hole interconnection 206 formed in a semiconductor substrate 210 and the surrounding structure thereof in a semiconductor apparatus 200.

In the semiconductor apparatus 200, a semiconductor chip 203 is bonded to a supporting substrate 201, which is a light-transmitting substrate such as a glass substrate, with a resin layer 208 in between.

The semiconductor chip 203 includes a semiconductor substrate 210 and a wiring layer 209. The semiconductor substrate 210 is made of silicon or the like on which a transistor, a protective film, and the like, not shown in the figure, are formed. The wiring layer 209 is formed on the semiconductor substrate 210 and includes stacked layers of conductive layers and insulating layers. The conductive layers include wiring, a pad electrode 202, and the like. The insulating layers are insulating interlayers or the like that covers the conductive layers.

In addition, the semiconductor chip 203 is provided with a light-receiving/emitting element, a light-receiving/emitting sensor surface (not shown) and the like. In addition, a color filter and an on-chip lens (not shown) corresponding to the sensor surface are formed above the wiring layer 209.

In the semiconductor chip 203, furthermore, the through-hole interconnection 206 is formed through the semiconductor substrate 210 and connected to the pad electrode 202. The through-hole interconnection 206 is made by forming a via hole toward the pad electrode 202 formed in the wiring layer 209 from the side opposite to a side on which the wiring layer 209 of the semiconductor substrate 210 is formed and by covering the inside of the via hole with a conductive layer 205. Here, the conductive layer 205 is formed from the pad electrode 202 to the lower part of the semiconductor substrate 210 through the through-hole interconnection 206. The conductive layer 205 is connected to an external terminal 207 of the semiconductor apparatus 200 at the lower part of the semiconductor substrate 210.

In addition, an insulating layer 204 is formed between the semiconductor substrate 210 and the conductive layer 205 in the semiconductor apparatus 200. A protective layer 217 made of an insulating resin such as a solder resist covers the whole surface, except the portion where the conductive layer 205 and the external terminal 207 are connected.

Moreover, a resin layer 211 is formed between the conductive layer 205 and the insulating layer 204, at a position corresponding to the position where the external terminal 107 is formed. The resin layer 211 is a member for reducing the stress on the external terminal 207.

Next, a method for forming the through-hole interconnection 206 of the semiconductor apparatus 200 shown in FIG. 2 will be described.

FIG. 3A illustrates the semiconductor substrate 210 and the wiring layer 209 formed thereon in the semiconductor chip 203 in a state before the formation of the through-hole interconnection 206. As shown in FIG. 3A, the semiconductor apparatus 200 shown in FIG. 2 is represented upside down.

The wiring layer 209 is formed by stacking a plurality of insulating layers 212 and a plurality of wiring lines 213. In addition, the pad electrode 202 for interconnecting the external terminal and the semiconductor chip 203 is formed in the wiring layer 209.

Next, for example, a resist pattern or the like is formed on the semiconductor chip 203 using photolithography and the semiconductor chip 203 is then subjected to a dry-etching process. As shown in FIG. 3B, an opening 214 for a via hole is formed in the semiconductor chip 203.

At this time, electric charges are accumulated on the surface of the insulating layer 212 when the semiconductor substrate 210 is dry-etched. Accordingly, the etching is carried out in the lateral direction near the boundary between the semiconductor substrate 210 and the insulating layer 212. Therefore, side etching is locally carried out on the side of the semiconductor substrate 210 near the boundary between the semiconductor substrate 210 and the insulating layer 212. Thus, a V-shaped recessed portion 215 or a notch is formed.

Subsequently, the insulating layer 212 exposed to the opening 214 of the semiconductor substrate 210 is etched to expose the pad electrode 202. As a result, as shown in FIG. 4C, a via hole 216 is formed through the semiconductor substrate 210 to the pad electrode 202. At this time, at a position corresponding to the recessed portion 215 formed in the semiconductor substrate 210, the insulating layer 212 is also subjected to the side etching process. Thus, the recessed portion 215 is also formed in the insulating layer 212.

Next, as shown in FIG. 4D, the insulating layer 204 is formed to cover both the semiconductor substrate 210 and the wiring layer 209 in the via hole 216. The coverage of the insulating layer 204 on the surface of the semiconductor substrate 210, the coverage thereof on the lateral surface inside the via hole 216, and the coverage thereof on the bottom surface of the via hole 216 are different from each other. Thus, the insulating layer 204 is formed thick on the semiconductor substrate 210 and thin on the pad electrode 202 and on the wall near the bottom of the via hole 216. Furthermore, the insulating layer 204 in the via hole 216, which is thinly formed, is removed from the pad electrode 202 by etching. As a result, part of the pad electrode 202 is exposed as shown in FIG. 5E. In this case, in other words, only the insulating layer 204 on the bottom of the via hole 216 can be removed using the difference in the coverage without using any mask or the like.

Subsequently, after the formation of a barrier metal and a seed metal (not shown), as shown in FIG. 5F, the exposed pad electrode 202 is rewired to form the conductive layer 205 connected to the external terminal 207 of the semiconductor apparatus 200.

Subsequently, the protective layer 217 is formed on the part of the conductive layer 205 other than the portion where the external terminal 207 is formed. As a result, the through-hole interconnection 206 of the semiconductor apparatus 200 as shown in FIG. 2 can be formed.

Alternatively, there is another method for forming a through-hole interconnection on a semiconductor substrate to avoid the formation of a recessed portion or a notch, in the boundary between the aforementioned semiconductor substrate and the insulting layer on the semiconductor (see, for example, P. R. Morrow, et al., "Three-Dimensional Wafer Stacking Via Cu—Cu Bonding Integrated With 65-nm Strained-Si/Low-k CMOS Technology" IEEE Electron Device Letters, Vol. 27, No 5, MAY 2006). In this method, the process of etching a semiconductor substrate to form a via hole through both the semiconductor substrate and the insulating layer is divided into two or more steps.

For example, the process has two divided steps of etching the semiconductor substrate. As shown in FIG. 6A, first, etching of the semiconductor substrate 210 is carried out at a high etching rate to form part of an opening 218a to be provided as a via hole in the semiconductor substrate 210 and the insulating layer 212. Subsequently, the etching of the semiconductor substrate 210 is carried out at a low etching rate to etch the semiconductor substrate 210 to the boundary with the insulating layer 212 as shown in FIG. 6B.

At this time, the angle of the internal surface of the opening 218a is changed at the position where the first step of etching the semiconductor substrate 210 is switched to the second step, resulting in a tapered opening 218a.

Furthermore, as shown in FIG. 7C, the pad electrode 202 is partially exposed by etching the insulating layer 212. A via hole 218 is formed through the semiconductor substrate 210 and the insulating layer 212. Subsequently, as shown in FIG. 7D, the insulating layer 204 is formed on the surfaces of the semiconductor substrate 210 and the via hole 218 as shown in FIG. 7D and the conductive layer 205 connecting to the pad electrode 202 is then formed.

After that, the semiconductor apparatus 200 with the through-hole interconnection 206 as shown in FIG. 2 can be completed by forming a protective film, an external terminal, and the like.

According to the method, etching is carried out at a low etching rate when etching near the boundary between the insulating layer and the semiconductor substrate to suppress the formation of a recessed portion. In addition, the initial etching of the semiconductor substrate is carried out at a high etching rate, thereby producing a semiconductor apparatus without lowering the rate of forming a via hole.

SUMMARY OF THE INVENTION

As described above, in the case of the semiconductor apparatus in which the through-hole interconnection is formed in the semiconductor chip as shown in FIG. 2, electric charges are accumulated on the surface of the insulating layer when the semiconductor chip is dry-etched as shown in FIG. 3B. As a result, the recessed portion 215 or notch is formed in the semiconductor chip at the boundary thereof with the insulting layer. Further, when the insulating layer is etched where the recessed portion 215 is formed in the semiconductor chip, the same recessed portion 215 is also formed in the insulating layer at the boundary with the semiconductor chip. As shown in FIG. 4D, when the insulating layer and the wiring line is formed in the via hole 216 where the recessed portion 215 is formed in the via hole 216, both the barrier metal and the seed metal formed in the recessed portion 215 may be thinner than other portions or may not be formed. Therefore, a wiring line may not be formed stably by electrolytic plating because of disconnection of the seed metal or undesirable characteristics of the recessed portion 215.

Furthermore, even in the case of forming a wiring line without disconnection of the seed metal, a convex portion corresponding to the recessed portion 215 is also formed on the wiring line. Then, the convex portion of the wiring line receives the stress concentration due to thermal expansion of a wiring material caused by heat history in the production process of the semiconductor apparatus or the generation of heat at the time of operation. Therefore, in the context of after the heat process as schematically shown in FIG. 8, some cracks may occur on the periphery of the recessed portion 215 between the semiconductor chip 203 and the wiring layer 209. The boundary between the wiring line 205 and the pad electrode 202 and the wiring layer 209 may be damaged by such cracks. As a result, malfunction of the semiconductor apparatus may occur.

As described above, the recessed portion existing on the boundary between the semiconductor chip and the wiring layer causes a decrease in yield when manufacturing a semiconductor apparatus and a decrease in reliability thereof.

Furthermore, in the case of forming a via hole by two or more divided etching steps as in the case of P. R. Morrow, et al., "Three-Dimensional Wafer Stacking Via Cu—Cu Bonding Integrated With 65-nm Strained-Si/Low-k CMOS Technology" IEEE Electron Device Letters, Vol. 27, No 5, MAY 2006 as described above, the formation of a recessed portion on the boundary between the semiconductor substrate and the insulating layer can be suppressed.

In this case as shown in FIG. 7D, however, the inner surface of the via hole 218 is formed with a changed angle at a position 219 where the etching rate of the semiconductor is changed. Then, the semiconductor substrate 210 may have some cracks due to the stress concentration of the conductive layer 205 formed in the via hole 218 at the position 219 where the angle of the inner surface is changed. It may lead to deteriorated electric characteristics and a decrease in reliability of the semiconductor apparatus.

Furthermore, when the pad electrode 202 is exposed by etching back the insulating layer 204 formed on the inner surface of the via hole 218, the insulating layer 204 on a portion 220 with a gentle slope angle of the inner surface of the vial hole 218 is excessively etched compared to other portions. Therefore, at the portion 220 with a gentle slope angle of the inner surface, the thickness of the insulating layer 204 becomes small or the insulating layer 204 may be completely removed, thereby exposing semiconductor substrate 210. Therefore, in the semiconductor apparatus, the insulation properties of both the semiconductor substrate 210 and the conductive layer 205 may be reduced, causing a decrease in electric characteristics and a decrease in reliability of the semiconductor apparatus.

It is desirable to provide a highly reliable semiconductor apparatus with a through-hole interconnection.

According to an embodiment of the present invention, there is provided a semiconductor apparatus that includes a semiconductor substrate, an insulating layer, a via hole, and a through-hole interconnection. The insulating layer is formed on the semiconductor substrate. The via hole is formed through the semiconductor substrate and the insulating layer. The through-hole interconnection has a conductive layer formed on an insulating layer in the via hole. The surface of the insulating layer formed on the inner surface of the via hole is substantially planarized by filling a recessed portion on a boundary between the semiconductor substrate and the insulating layer formed on the semiconductor substrate.

According to an embodiment of the present invention, there is provided a method for manufacturing a semiconductor apparatus. The method includes the steps of:

forming an insulating layer on one side of a semiconductor substrate;

forming an opening for a via hole by etching from the other side of the semiconductor substrate;

forming an insulating layer on the inner surface of the opening;

forming a via hole by etching both the bottom of the insulating layer formed on the inner surface of the opening and the insulating layer formed on one side of the semiconductor substrate; and forming a conductive layer in the via hole.

According to the embodiments of the semiconductor apparatus and the method for manufacturing the semiconductor apparatus of the present invention, the through-hole interconnection is configured such that the inner surface of the via hole is allowed to be planarized by filling the recessed portion formed in the semiconductor substrate with the insulating layer. Subsequently, the conductive layer is formed on the planarized insulating layer. Thus, when the via hole is formed, the conductive layer is formed on the planarized surface without being affected by the recessed portion formed on the boundary between the semiconductor substrate and the insulating layer on the inner surface of the via hole, and the through-hole interconnection can be formed. Therefore, the reliability of the semiconductor apparatus can be improved, because the conductive layer is prevented from forming a portion, such as a convex portion, where the stress of thermal expansion due to thermal history or the like may be concentrated.

According to an embodiment of the present invention, a highly reliable semiconductor apparatus with a through-hole interconnection can be obtained.

BRIEF DESCRIPTION OF THE DRAWINGS

FIG. 3A and FIG. 3B illustrate different steps of the process.

FIG. 4C and FIG. 4D illustrate different steps of the process.

FIG. 5E and FIG. 5F illustrate different steps of the process.

FIG. 6A and FIG. 6B illustrate different steps of the process.

FIG. 7C and FIG. 7D illustrate different steps of the process.

FIG. 11A and FIG. 11B illustrate different steps of the process.

FIG. 13D and FIG. 13E illustrate different steps of the process.

FIG. 14F and FIG. 14G illustrate different steps of the process.

FIG. 15H and FIG. 15I illustrate different steps of the process.

FIG. 16J and FIG. 16K illustrate different steps of the process.

FIGS. 17A to 17C are cross-sectional views illustrating the manufacturing process of the semiconductor apparatus according to an embodiment of the present invention, where FIG. 17A, FIG. 17B, and FIG. 17C illustrate different steps of the process, respectively.

DESCRIPTION OF THE PREFERRED EMBODIMENTS

Embodiments of the present invention will be described with reference to the attached drawings.

Figure 1:
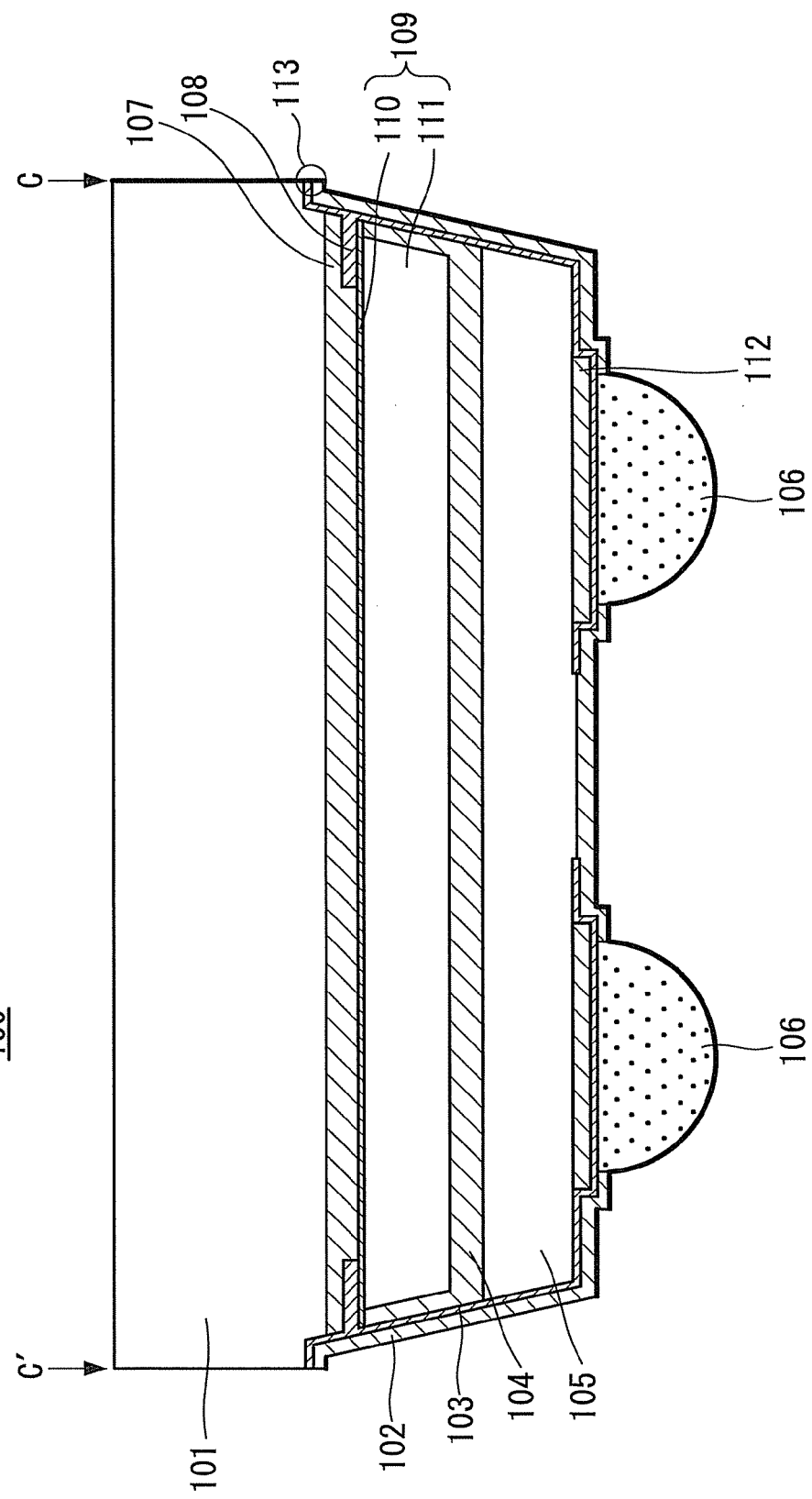
FIG. 1 is a cross-sectional view illustrating a semiconductor apparatus according to the related art.
Figure 2:
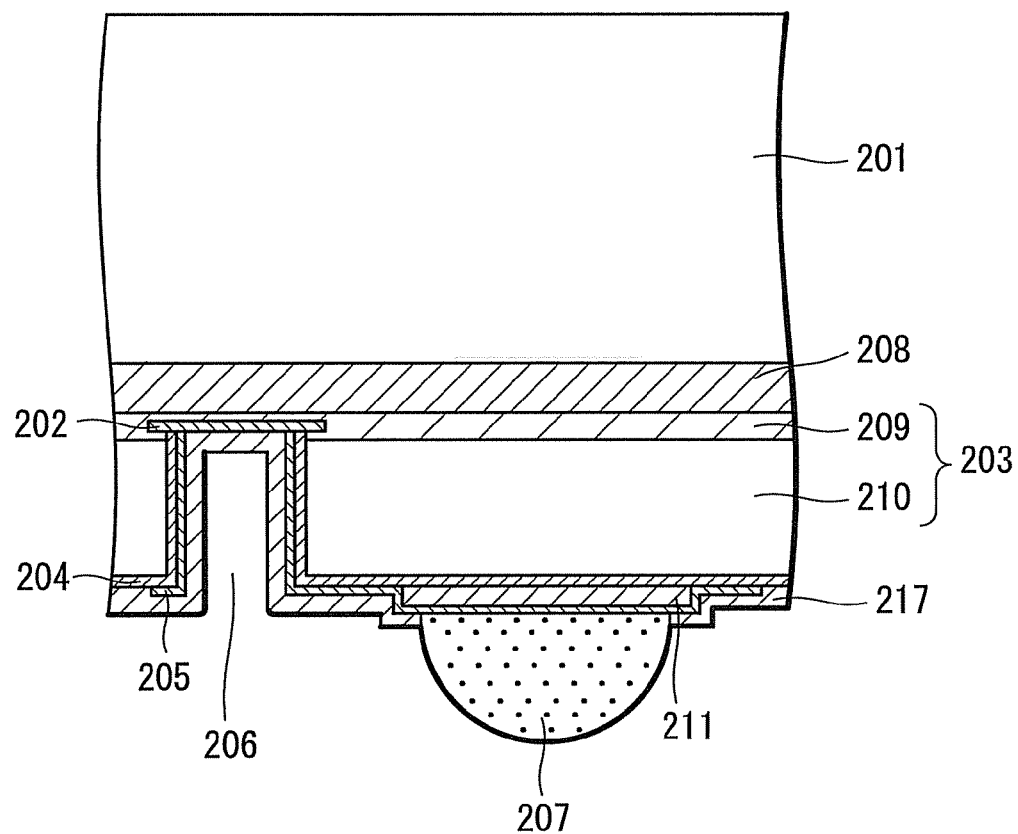
FIG. 2 is a cross-sectional view illustrating a through-hole interconnection used in the related-art semiconductor apparatus.
Figure 3A:
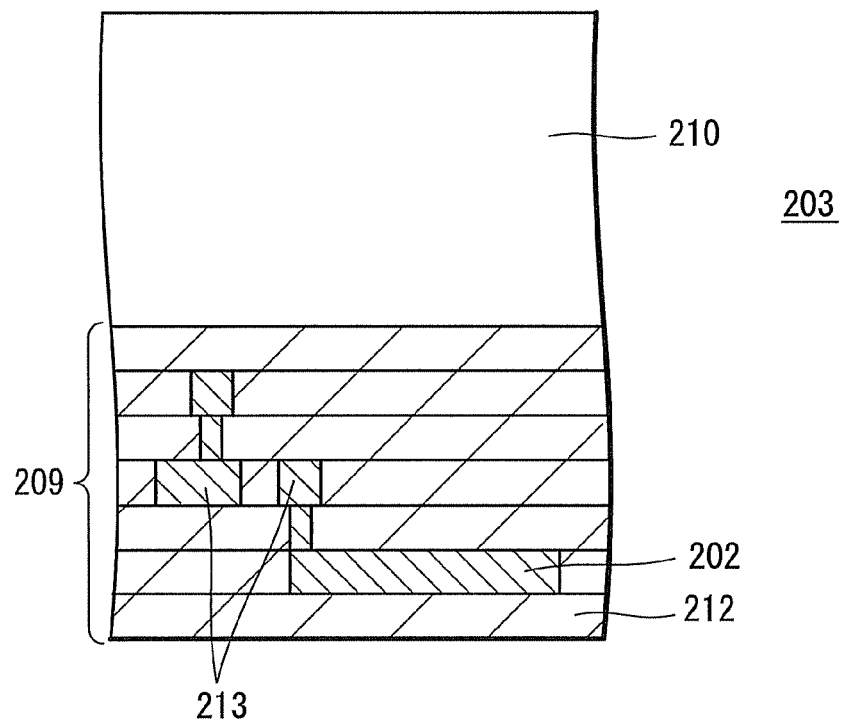
FIGS. 3A and 3B are cross-sectional views illustrating a manufacturing process of the through-hole interconnection used in the related-art semiconductor apparatus, where
Figure 3B:
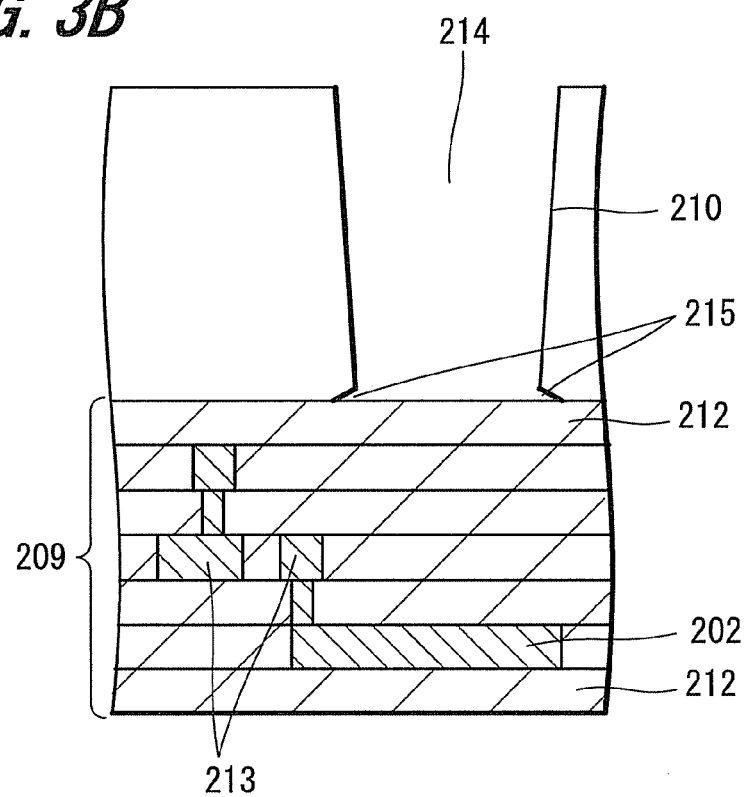
Figure 4C:
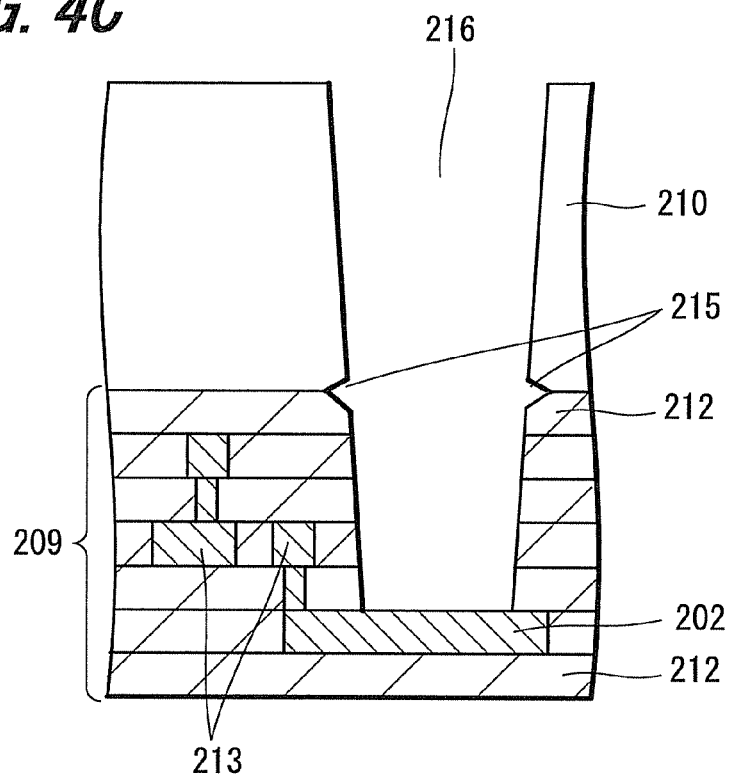
FIGS. 4C and 4D are cross-sectional views illustrating a manufacturing process of the through-hole interconnection used in the related-art semiconductor apparatus, where
Figure 4D:
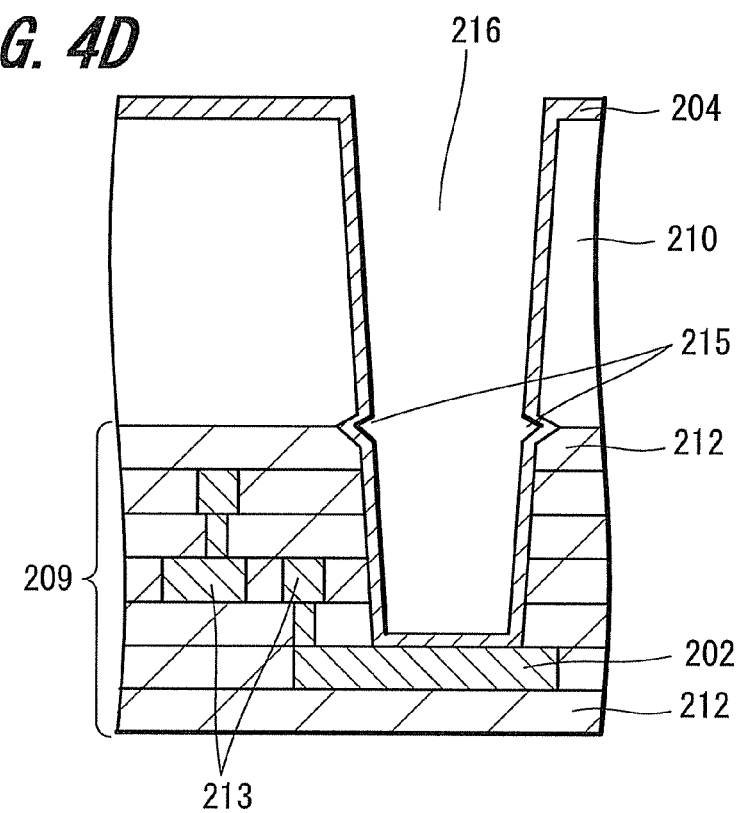
Figure 5E:
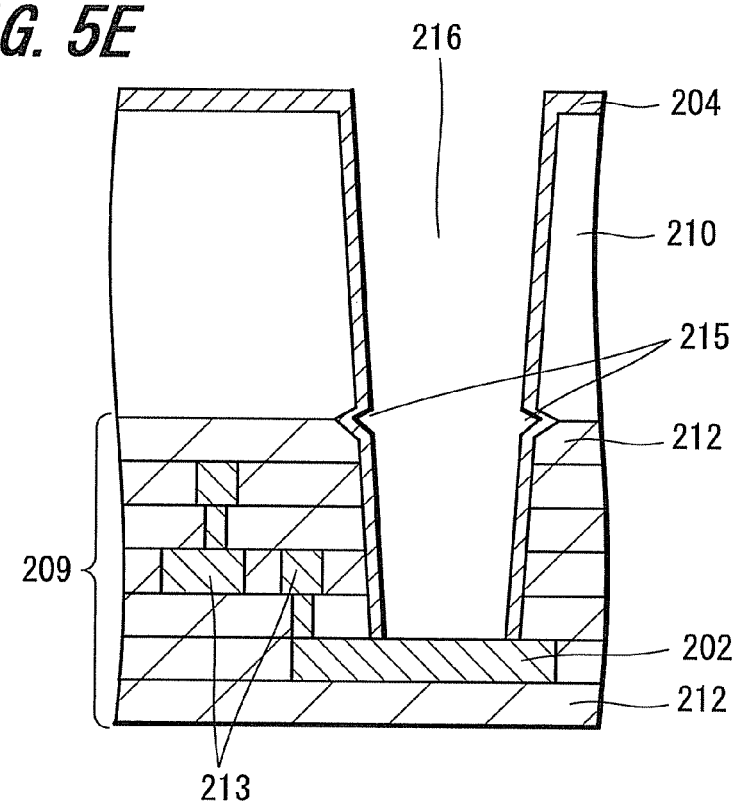
FIGS. 5E and 5F are cross-sectional views illustrating a manufacturing process of the through-hole interconnection used in the related-art semiconductor apparatus, where
Figure 5F:
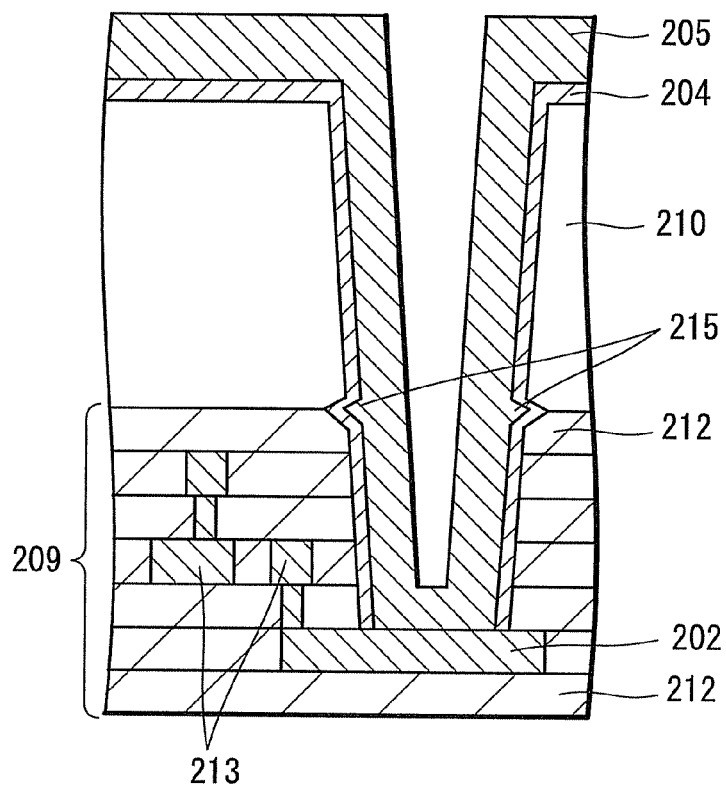
Figure 6A:
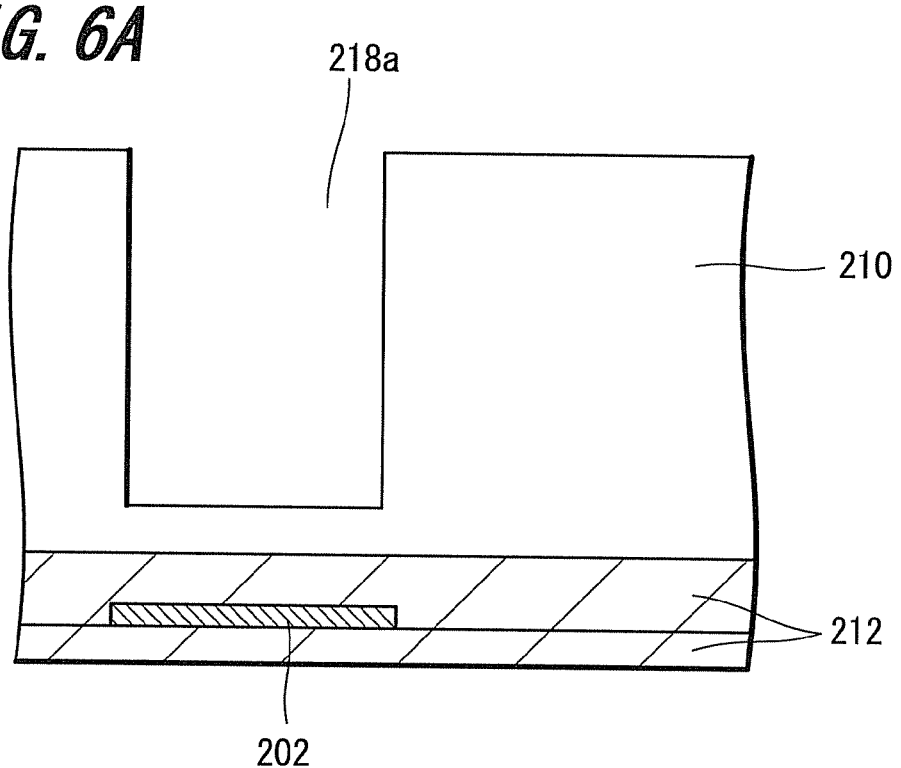
FIGS. 6A and 6B are cross-sectional views illustrating a manufacturing process of a through-hole interconnection used in the related-art semiconductor apparatus, where
Figure 6B:
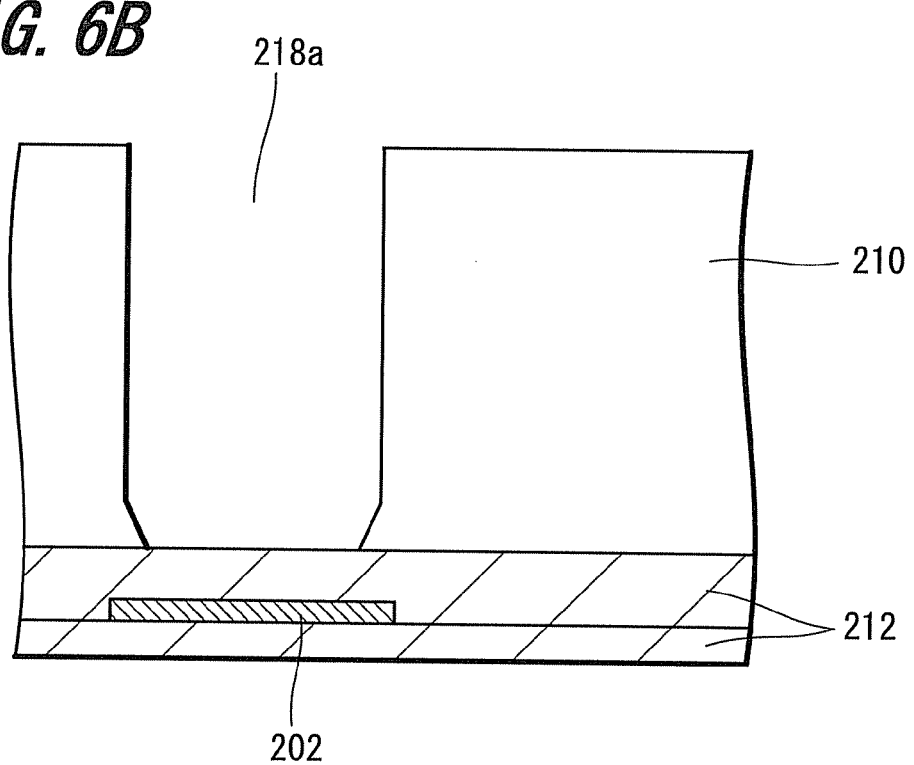
Figure 7C:
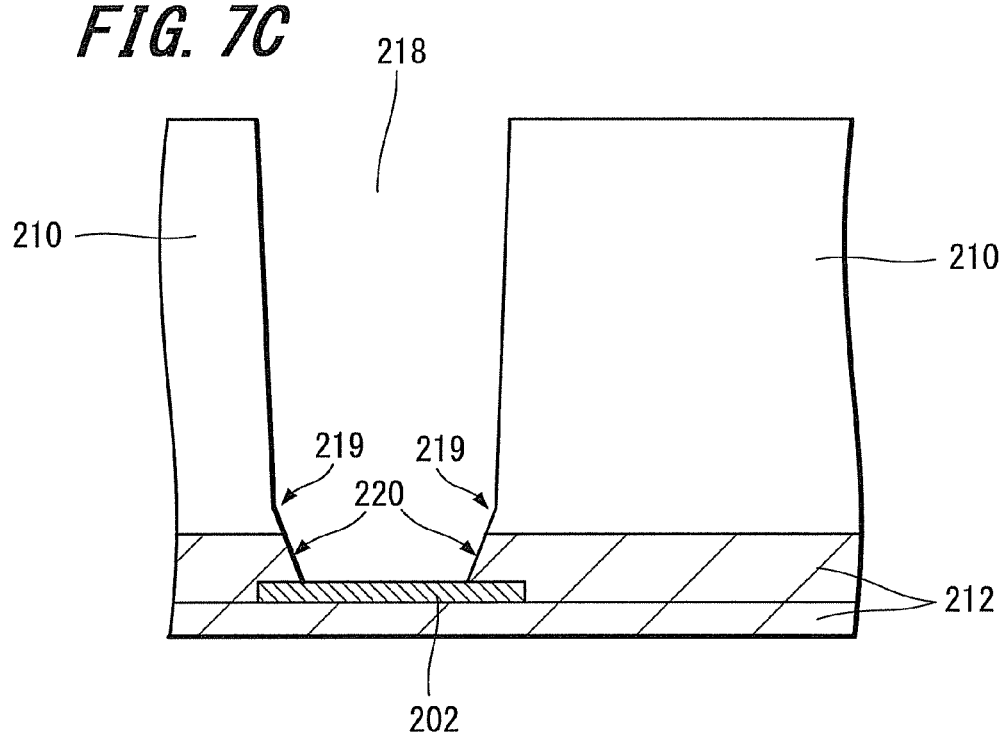
FIGS. 7C and 7D are cross-sectional views illustrating the manufacturing process of the through-hole interconnection used in the related-art semiconductor apparatus, where
Figure 7D:
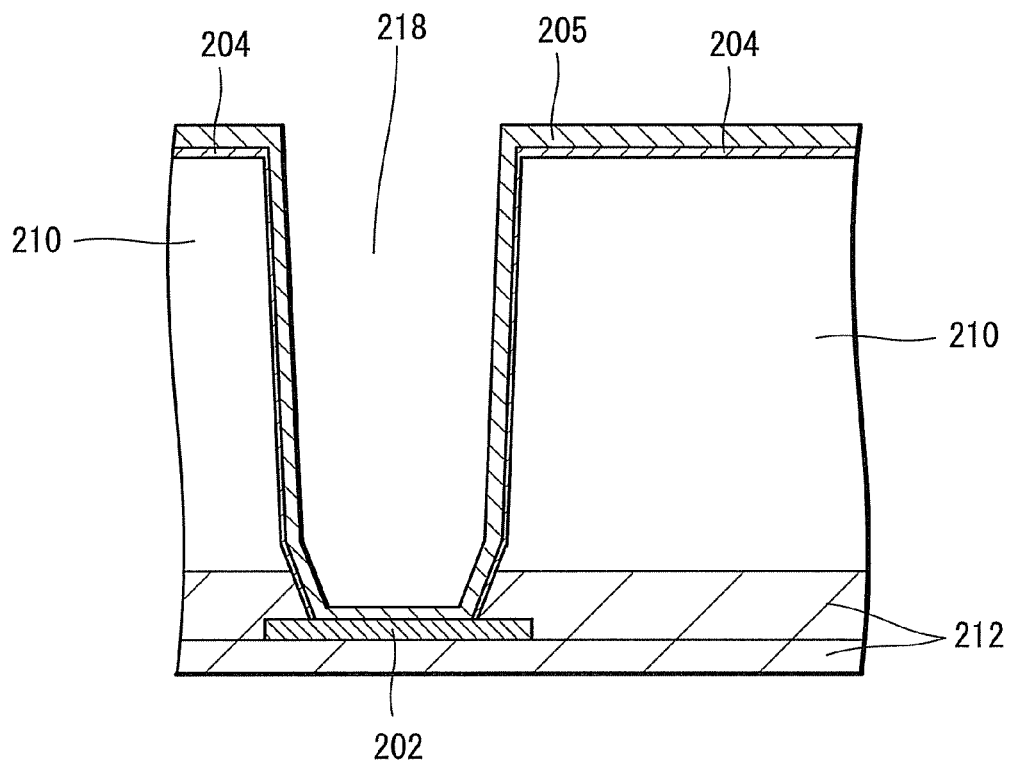
Figure 8:
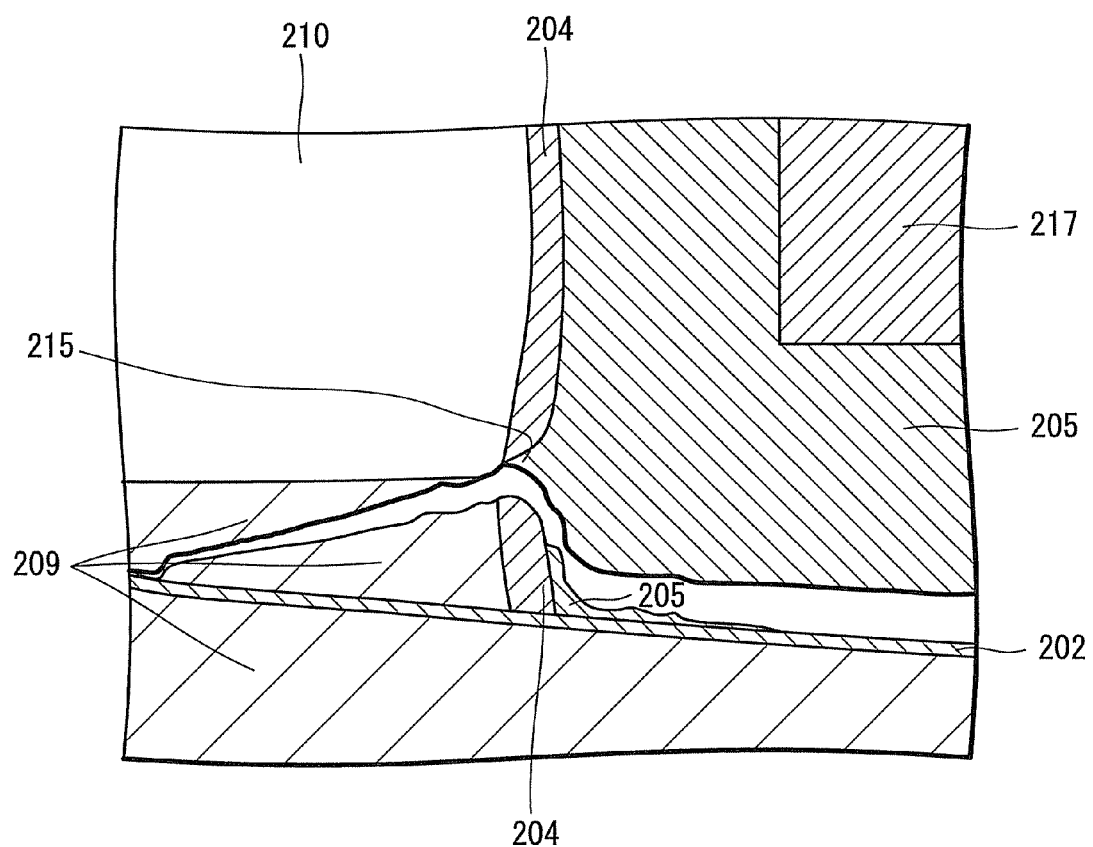
FIG. 8 is a cross-sectional view illustrating the cracked condition of the through-hole interconnection used in the related-art semiconductor apparatus.
Figure 9:
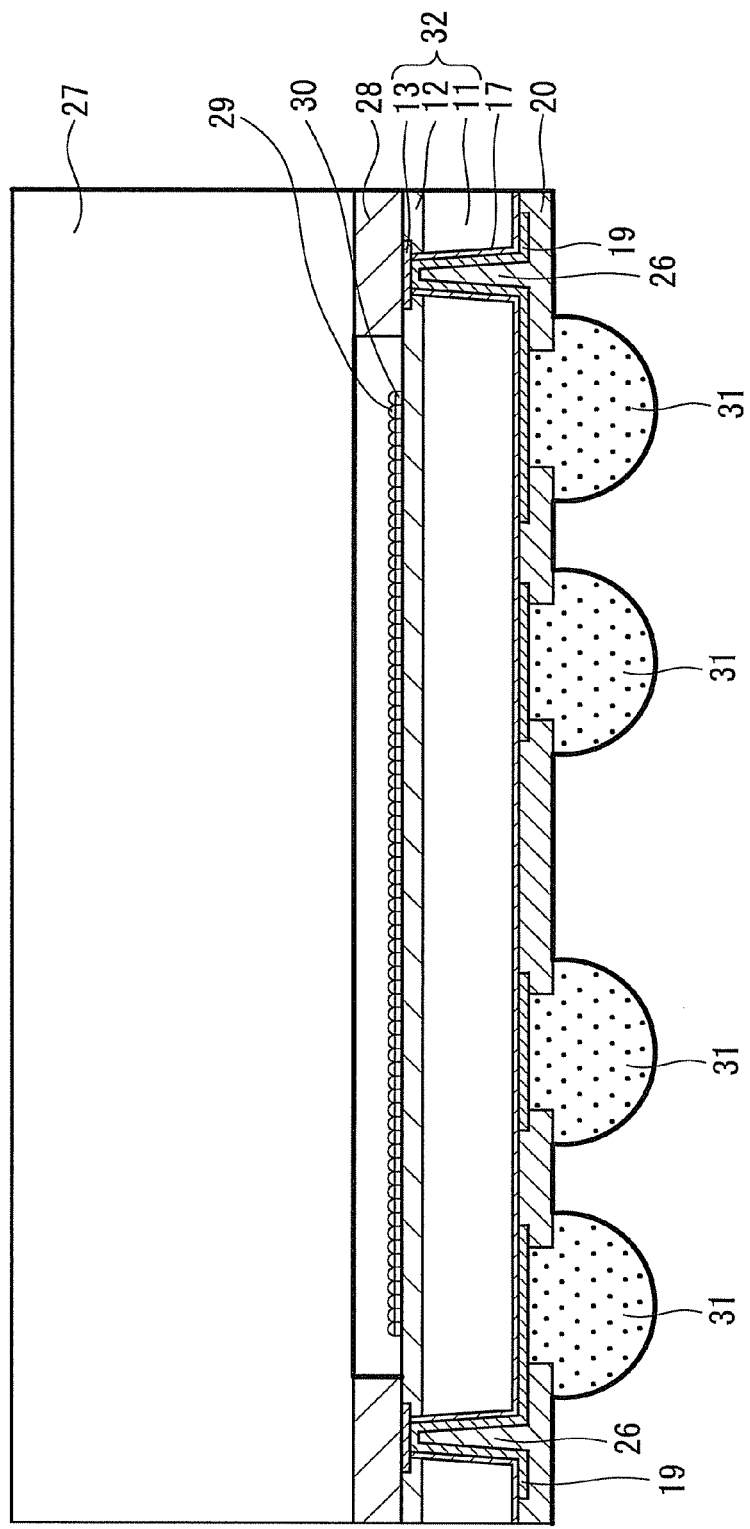
FIG. 9 is a cross-sectional view of a semiconductor apparatus according to an embodiment of the present invention.

FIG. 9 is a cross-sectional view illustrating a semiconductor apparatus 10 according to an embodiment of the present invention.

The semiconductor apparatus 10 includes a semiconductor chip 32, a supporting substrate 27 connected to the semiconductor chip 32 with an adhesive layer 28 in between, a through-hole interconnection 26 formed in the semiconductor chip 32, a conductive layer 19 connected to an external terminal 31 pulled out to the backside of the semiconductor chip 32 from the through-hole interconnection 26, and a protective layer 20 that seals the semiconductor chip 32.

The semiconductor chip 32 may include a semiconductor substrate 11 such as one made of silicon on which an active element, such as a transistor, and a protective film, not shown in the figure are formed. In addition, the semiconductor chip 32 may include a wiring layer 12 formed on the semiconductor substrate 11. The wiring layer 12 has a structure in which a conductive layer including wiring (not shown) and a pad electrode 13 and an insulating layer such as an insulating interlayer covering the conductive layer are stacked.

Furthermore, for example, the semiconductor chip 32 may include a light-emitting/receiving element. For example, the semiconductor chip 32 may include a light-receiving element and/or a light-emitting element or a light-reception and/or light-emission sensor surface formed but not shown in the figure. In addition, for example, a microlens 29 and a color filter 30 corresponding to the sensor surface may be formed above the wiring layer 12.

The supporting substrate 27 is made of a light-transmitting substrate such as glass. The supporting substrate 27 is connected to the surface of the semiconductor chip 32 on which active elements are formed (i.e., the principle surface thereof) with the adhesive layer 28 in between. As shown in FIG. 9, there is a space between the supporting substrate 27 and the principle surface of the semiconductor chip 32. Alternatively, for example, such a space may be filled with a light-transmitting resin or the like.

In addition, the semiconductor chip 32 is provided with a through-hole interconnection 26 formed through the semiconductor substrate 11 and connected to the pad electrode 13. The through-hole interconnection 26 has a via hole formed from the side (backside) of the semiconductor chip 32, which is opposite to one on which an active element is formed, to the pad electrode 13 formed in the wiring layer 12. The internal surface of the via hole is covered with the conductive layer 19. The conductive layer 19 is formed from the pad electrode 13 along the inner side of the through-hole interconnection 26 while being formed on the backside of the semiconductor chip 32 so that it connects to the external terminal 31 on the backside of the semiconductor chip 32.

In addition, for preventing electric current from passing through the conductive layer 19 and the semiconductor substrate 11 due to the contact with each other, an insulating layer 17 is formed so as to cover the backside of the semiconductor substrate 11 and the inner side of the through-hole interconnection 26.

Furthermore, the protective layer 20 is formed on the entire surface of the conductive layer 19 on the backside of the semiconductor chip 32, excepting the portion where the conductive layer 19 is in contact with the external terminal 31. The protective layer 20 may be made of an insulating resin or the like, such as a polyimide resin or a solder resist.

Figure 10:
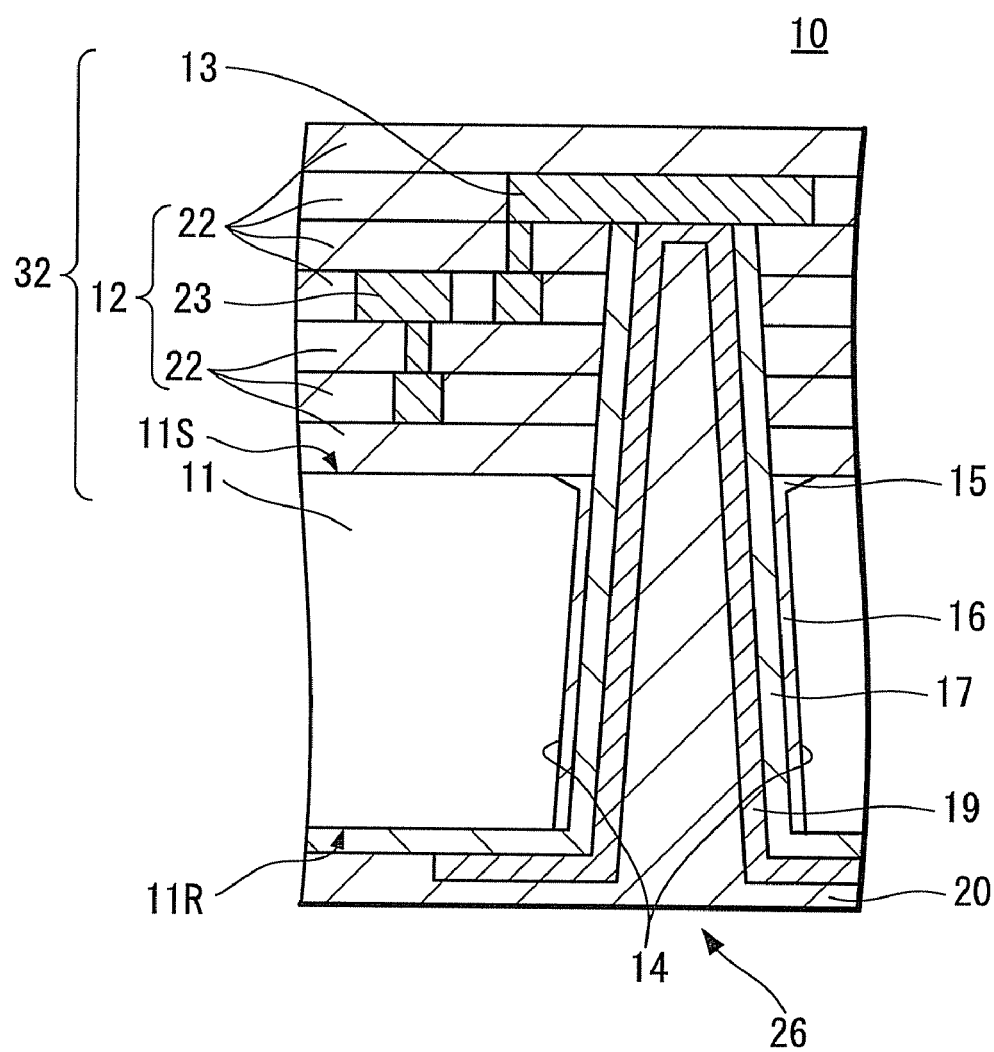
FIG. 10 is an enlarged cross-sectional view illustrating the surroundings of a through-hole interconnection used in the semiconductor apparatus according to an embodiment of the present invention.

FIG. 10 is a cross-sectional view illustrating in an enlarged scale the surroundings of the through-hole interconnection 26 in the semiconductor apparatus 10 shown in FIG. 9.

In the semiconductor apparatus 10, as shown in FIG. 10, the wiring layer 12 includes a structure of a plurality of insulating layers 22 and a plurality of metal wiring lines 23 stacked on the surface of the semiconductor chip 32 on which the active element is formed. The pad electrode 13 is formed in the inside of the wiring layer 12 to interconnect the semiconductor chip 32 and the external terminal 31.

The insulating layers 22 may be made of $SiO_2$, SiN, SiC, SiCN, SiOCH, SiOF, or the like. The metal wiring line 23 and the pad electrode 13 are formed of stacked structures of, for example, Al, AlCu, AlSi, Cu, or the like and a refractory metal (barrier metal) such as Ti, TiN, Ta, or TaN. In this case, for example, the semiconductor chip 32 is formed so that the semiconductor substrate 11 may have a thickness of 30 μm or more and the wiring layer 12 may have a thickness of 1 μm to 10 μm.

A via hole 14, which is an opening from the side (backside) 11R opposite to the side (principle surface) 11S on which the wiring layer 12 of the semiconductor substrate 11, is formed in the semiconductor apparatus 10. Insulating layers 16 and 17 are formed on the inner surface of the via hole 14. Subsequently, the conductive layer 19 is formed on the backside 11R of the semiconductor chip 32 to be connected to the pad electrode 13 formed in the insulating layer 22, thereby forming the through-hole interconnection 26.

The through-hole interconnection 26 is formed such that the opening on the backside 11R of the semiconductor substrate 11 may have a diameter of 10 μm to 100 μm and a depth from the backside 11R of the semiconductor substrate 11 to the pad electrode 13 may be 30 μm or more.

In addition, in the via hole 14 formed in the semiconductor chip 32, a recessed portion 15 is formed near the boundary thereof with the insulating layer 22 of the semiconductor substrate 11. The insulating layer 16 is formed, filling the recessed portion 15. Furthermore, the insulating layer 17 is formed on the entire backside 11R of the semiconductor chip 32, covering the insulating layer 16 on the inner surface of the via hole 14 and the backside 11R of the semiconductor substrate 11.

Moreover, the protective layer 20 is formed on the entire backside 11R of the semiconductor chip 32, covering the conductive layer 19 and the insulating layer 17.

In the aforementioned semiconductor apparatus 10, the insulating layer 16 covers the via hole 14 of the semiconductor substrate 11 to fill the recessed portion 15 on the boundary between the semiconductor substrate 11 and the wiring layer 12. Furthermore, the insulating layer 17 is formed covering the insulating layer 16.

As described above, in the semiconductor apparatus 10, even in the case of the recessed portion 15 being formed through etching on the boundary between the semiconductor substrate 11 and the wiring layer 12, the recessed portion in the inner surface of the via hole 14 is filled with the insulating layers 16 and 17 so that the inner surface is almost planarized. Thus, the conductive layer 19 can be formed on the insulating layer 17 without being affected by the shape of the recessed portion 15 in the through-hole interconnection 26.

Therefore, the conductive layer 19 formed on the through-hole interconnection 26 is prevented from having a convex shape or the like that reflects the profile of the recessed portion 15. Thus, disadvantages, such as the concentration of stress due to the thermal expansion of a wiring material by heat history in the production process or the generation of heat at the time of operation of the semiconductor apparatus 10, can be prevented.

Furthermore, the surface of the insulating layer 17 is substantially flat. Thus, coatability of a seed metal or the like applied as a plating base layer of the conductive layer 19 can be improved when the conductive layer 19 is formed by a plating technique or the like. Further, production of a defective conductive layer 19 due to disconnection can be reduced. As a result, the conductive layer 19 can be formed stably and a decrease in yield can be suppressed when manufacturing the semiconductor apparatus.

Therefore, the yield of a semiconductor apparatus having a through-hole interconnection can be improved, while the reliability of the semiconductor apparatus can be improved.

The surface of the insulating layer 16 in the via hole 14 may have any shape that fills the recessed portion 15 to be substantially planarized. Specifically, the surface of the insulating layer 16 may need to be planarized so that the conductive layer 19 formed thereon is prevented from being reflected by the shape such as unevenness and prevented from causing any portion damaged by stress concentration due to thermal expansion of a wiring material or the like. In addition, the surface of the insulating layer 16 may be planarized enough to prevent the conductive layer 19 from lowering the coatability of a seed metal or causing disconnection or the like when forming the conductive layer by a plating method or the like.

As shown in FIG. 10, the semiconductor apparatus 10 has two insulating layers, i.e., the insulating layer 16 and the insulating layer 17 formed on the inner surface of the via hole 14. Alternatively, the insulating layer formed on the inner surface of the vial hole 14 may be a single layer.

The insulating layer formed on the inside of the via hole 14 may be any layer as long as it can fill the recessed portion 15 and planarize the inner surface of the via hole 14. Thus, at least one insulating layer is formed on the inner surface of the via hole 14.

If the insulating layer formed on the inner surface of the via hole 14 is formed of a single layer, the number of manufacturing steps can be reduced in comparison with the formation of more than one insulating layer.

Hereinafter, an example of a method for manufacturing a semiconductor apparatus according to an embodiment of the present invention, particularly a method for forming the through-hole interconnection 10 as shown in FIG. 10, will be described with reference to the attached drawings.

First, for example, a wiring layer 12 is formed by stacking an insulating layer 22, a wiring line 23, and a pad electrode 13 on the side of a semiconductor substrate 11 on which an active element is formed (i.e., the principle surface 11S thereof). Here, the semiconductor substrate 11 is a wafer made of silicon, GaAs, InP, or the like. The insulating layer 22 may be made of $SiO_2$, SiN, SiC, SiCN, SiOCH, SiOF, or the like. The wiring line 23 and the pad electrode 13 may be made of Al, AlCu, AlSi, Cu, or the like. In addition, any of an active elements such as a transistor, a light-receiving and/or a light-emitting element, a light-receiving and/or a light-emitting sensor surface, a color filter, an on-chip lens, and the like may be formed above the semiconductor substrate 11 and/or the wiring layer 12.

Figure 11A:
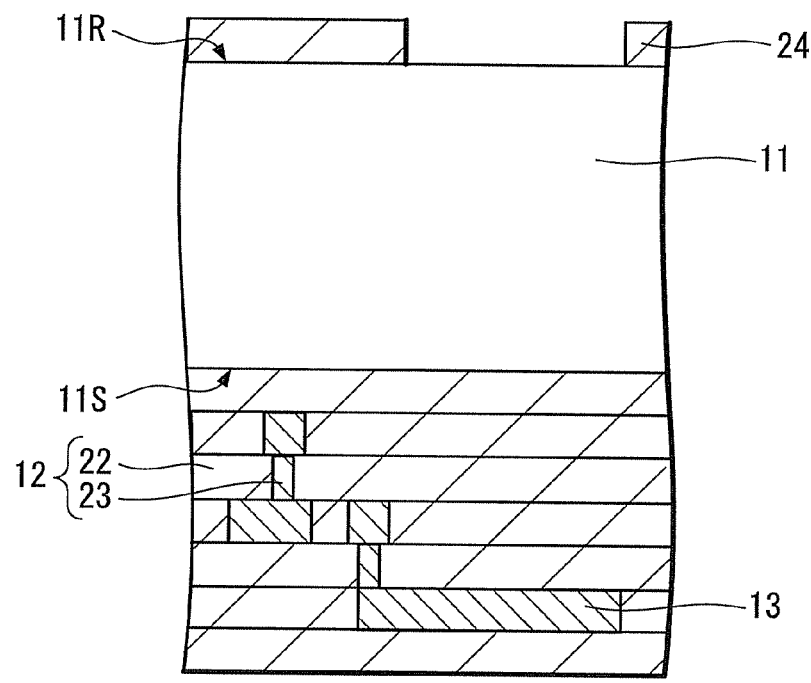
FIGS. 11A and 11B are cross-sectional views illustrating a manufacturing process of the semiconductor apparatus according to an embodiment of the present invention, where

As shown in FIG. 11A, a resist mask or a hard mask 24 made of $SiO_2$, SiN, or the like may be formed on the surface 11R of the semiconductor substrate 11, which is the backside thereof opposite to the side on which the active element is formed. The mask 24 is formed on the backside, except an area corresponding to the position of the pad electrode 13 where the via hole is formed in the semiconductor chip.

Next, the semiconductor substrate 11 is dry-etched with a gas including such as $SF_6$, $O_2$, fluorocarbon gas, or HBr from an opening of the mask 24 to form an opening 14a for a via hole in the semiconductor substrate 11.

Figure 11B:
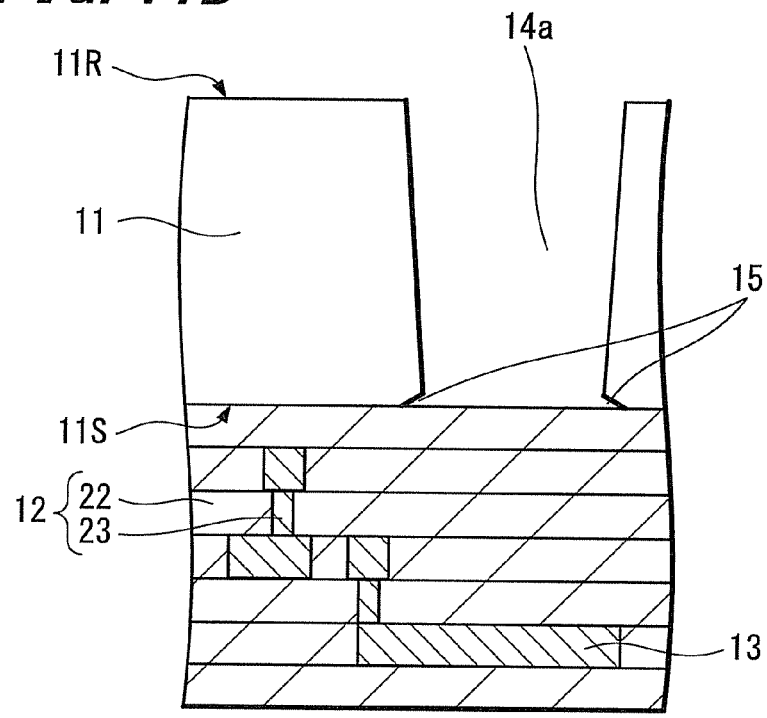

The semiconductor substrate 11 is etched until the insulating layer 22 is exposed from the bottom of the opening 14a. There may be a need to carry out over-etching on the semiconductor substrate 11 so that the insulating layer 22 is surely exposed from the opening 14a of the semiconductor substrate 11 in the whole wafer. At this time, electric charges are accumulated on the surface of the insulating layer when over-etching the semiconductor substrate 11. Thus, the etching proceeds in the lateral direction. Therefore, a side-etched portion is formed locally on the side of the semiconductor substrate 11 on the boundary between the semiconductor substrate 11 and the insulating layer 22. As a result, as shown in FIG. 11B, a V-shaped recessed portion 15 in cross section, or a so-called notch is formed in the semiconductor substrate.

Figure 12C:
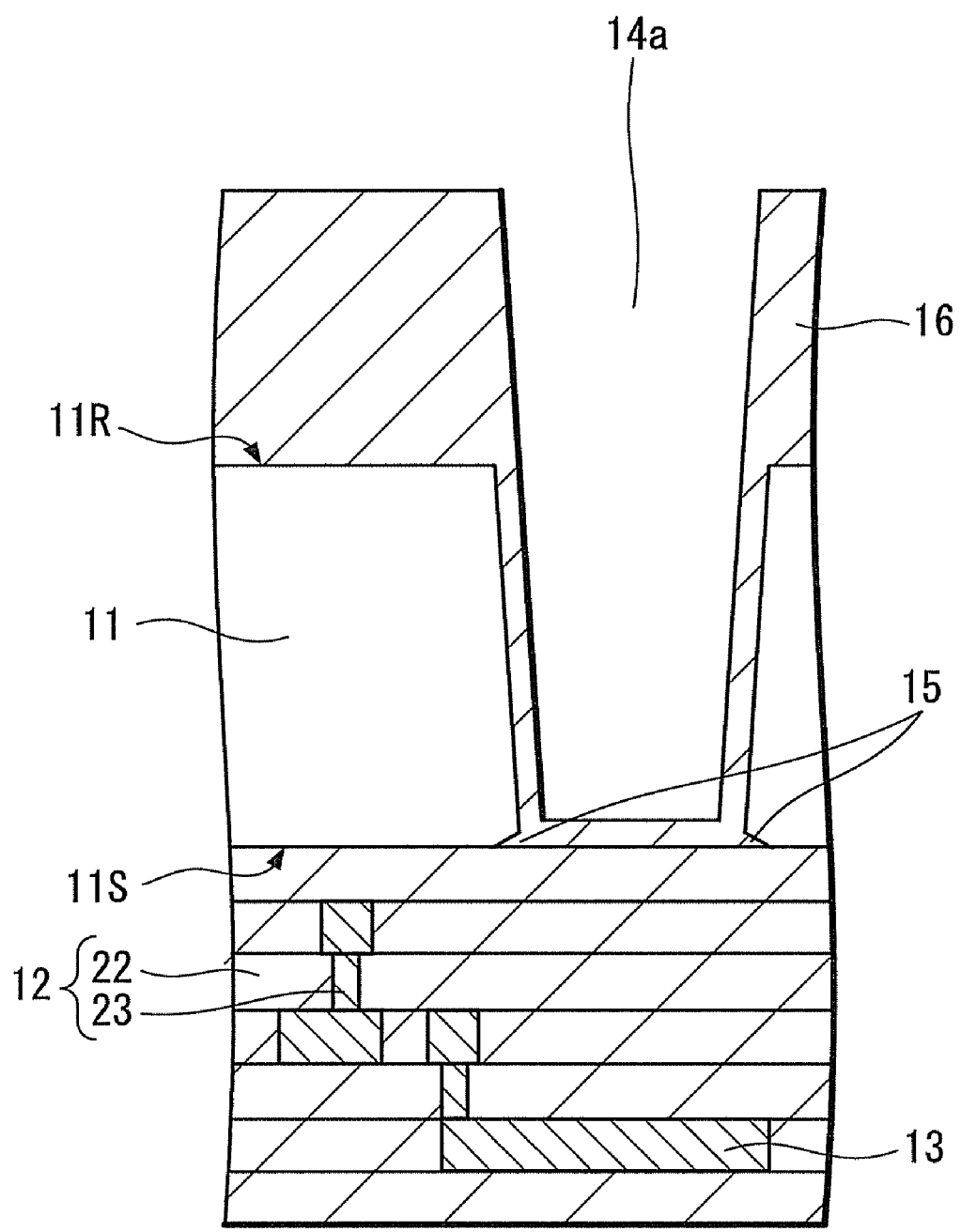
FIG. 12C is a cross-sectional view illustrating the manufacturing process of the semiconductor apparatus according to an embodiment of the present invention.

The mask 14 formed on the semiconductor substrate 11 is then removed therefrom. Subsequently, as shown in FIG. 12C, the backside 11R and the inner surface and the bottom of the opening 14a of the semiconductor substrate 11 are covered with an insulating layer 16.

The insulating layer 16 may be made of, for example, $SiO_2$, SiN, SiC, or SiCN. The material of the insulating layer 16 is preferably one having the same etching selectivity as that of the insulating layer 22 of the wiring layer 12 so that selective etch-back can be sequentially carried out on both the insulating layers 12 and 22 as described below. Moreover, it is also preferable that the layers 16 and 22 are made of the same material. In addition, the insulating layer 16 may be, for example, an inorganic film or an organic film prepared by plasma CVD, spin coating, spray coating, or the like.

Here, the insulating layer 16 can be formed with at least the thickness which can completely fill the recessed portion 15 formed in the semiconductor substrate 11. For filling the recessed portion 15 completely, for example, it is preferable that the insulating layer 16 has a thickness of about 1 μm or more at the bottom of the opening 14a. Thus, the recessed portion 15 is filled with the insulating layer 16 to prevent the boundary between the lateral surface and the bottom surface of the opening 14a from causing any recessed portion.

In addition, due to a difference in coverage, the insulating layer 16 is most thickly formed on the backside 11R of the semiconductor substrate 11 and most thinly formed at the bottom of the opening 14a.

Figure 13D:
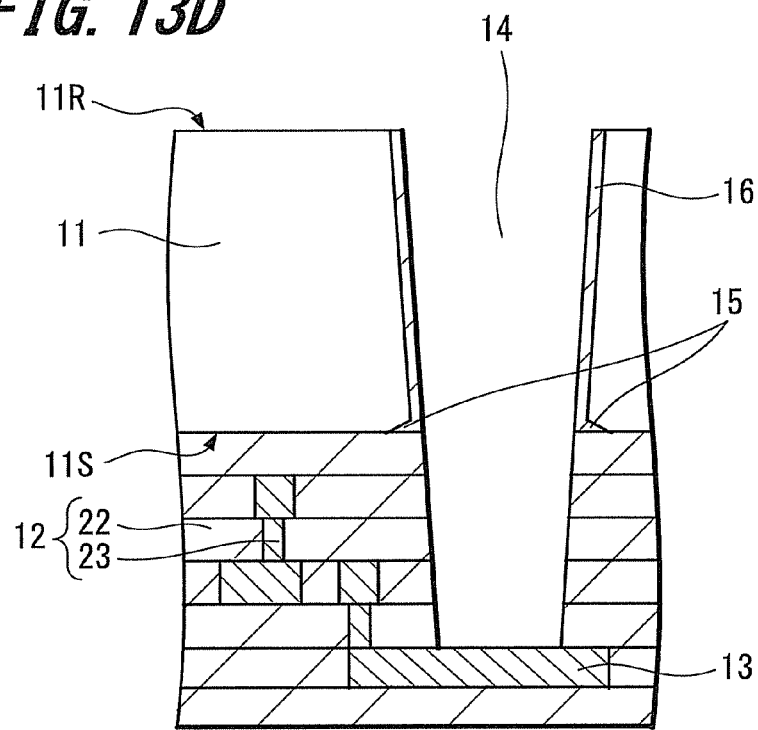
FIGS. 13D and 13E are cross-sectional views illustrating the manufacturing process of the semiconductor apparatus according to an embodiment of the present invention, where

Next, as shown in FIG. 13D, the insulating layer 16 is selectively etched back by dry etching with $CF_4$, $O_2$, or the like and the insulating layer 22 of the wiring layer 12 is then etched to expose the pad electrode 13, thereby forming a via hole 14.

The selective etch-back can be carried out on the insulating layer 16 using a difference in coverage of the insulating layer 16. As described above, the insulating layer 16 is thickly formed on the backside 11R of the semiconductor substrate 11 and the insulating layer 16 can be thinly formed in the via hole 16. Therefore, anisotropic etching is carried out on the insulating layer 16. Etching on the insulating layer 16 thickly formed on the backside 11R of the semiconductor substrate 11 allows both the insulating layer 16 formed at the bottom of the via hole 14 and the insulating layer 22 of the wiring layer 12 to be simultaneously etched. At this time, the insulating layer 16 formed on the inner surface of the via hole 14 remains in the via hole as shown in FIG. 13D due to a low etching rate.

As shown in FIG. 13D, the recessed portion 15 in the via hole 14 is completely covered with the insulating layer 16. Therefore, the inner surface of the via hole 14 from the backside 11R of the semiconductor substrate 11 to the pad electrode 13 can be substantially planarized without being affected by the shape of the recessed portion 15.

In FIG. 13D, the insulating layer 16 remains on the inner surface of the via hole 14 while being removed from the backside 11R of the semiconductor substrate 11. Alternatively, the insulating layer 16 may remain on the backside 11R of the semiconductor substrate 11. In addition, the thickness of the remaining insulating layer 16 on the inner surface of the via hole 14 may be optionally changed as long as the recessed portion 15 is completely filled therewith.

Furthermore, in the above steps, it is preferable that the part of the insulating layer 16 on the backside 11R of the semiconductor substrate 11 is thicker than other parts thereof. For forming the via hole 14 as shown in FIG. 13D, the insulating layer 16 formed at the bottom of the opening 14a shown in FIG. 12C is subjected to a selective etch-back process. Subsequently, the insulating layer 22 on the pad electrode 13 is etched.

If the insulating layer 16 remains on the backside 11R of the semiconductor substrate 11 when the insulating layer 16 is selectively etched back to expose the bottom of the opening 14a and the insulating layer 22 is further etched back, the insulating layer 16 on the inner surface of the semiconductor substrate 11 can remain. In this case, it is possible to omit an insulating layer 17 as described later formed on the insulating layer 16.

As described above, a selective etch-back process can be successively carried out on both the insulating layer 16 and the insulating layer 22 when these layers 16 and 22 are etched using the materials having the same etching selectivity or preferably using the same material. In addition, the coverage of the insulating layer 16 in the inside of the via hole 14 can be retained by selecting an appropriate thickness of the insulating layer 16 on the backside 11R of the semiconductor substrate 11.

Figure 13E:
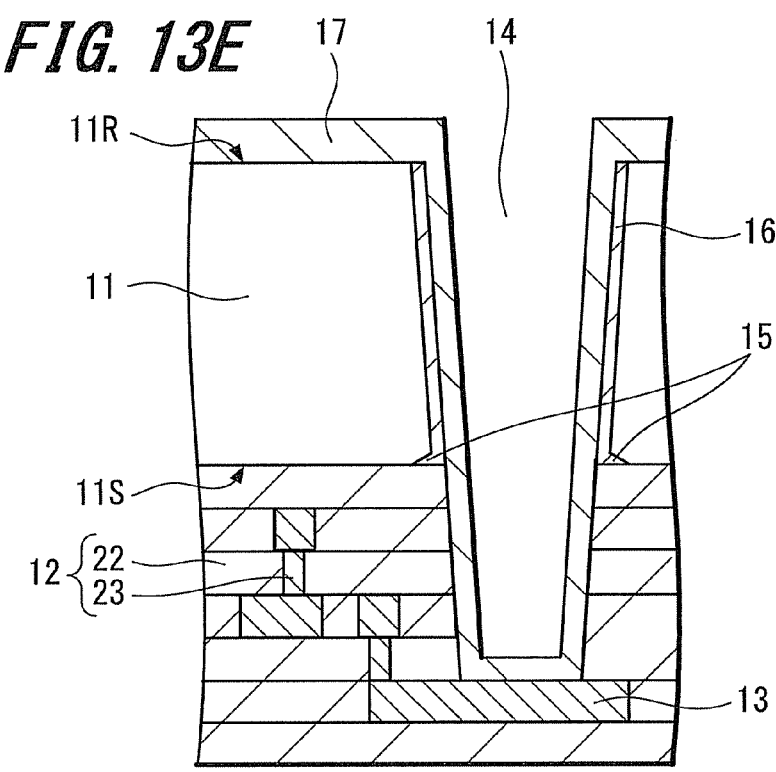

Next, as shown in FIG. 13E, the insulating layer 17 is formed again in the inside of the via hole 14 and on the backside 11R of the semiconductor substrate 11.

For example, the insulating layer 17 may be formed from $SiO_2$, SiN, SiC, SiCN, SiOCH, SiOF, or the like using a plasma CVD method. Alternatively, a resin film made of a polyimide resin may be formed by spin coating, spray coating, or the like.

The inner surface of the via hole 14 is substantially planarized by filling the recessed portion 15 with the insulating layer 16. Therefore, the insulating layer 17 can be also substantially planarized without being affected by the shape of the recessed portion 15.

At this time, the insulating layer 17 is most thickly formed on the backside 11R of the semiconductor substrate 11, while the insulating layer 17 is most thinly formed on the wall of the via hole 14 near the bottom thereof. At this time, if the thickness of the insulating layer 17 is smaller than the desired thickness, the conductive layer formed on the insulating layer 17 may not be insulated sufficiently from the semiconductor substrate. Thus, for example, it is preferable that the insulating layer 17 is formed with a thickness of about 500 nm at the bottom of the via hole 14.

Figure 14F:
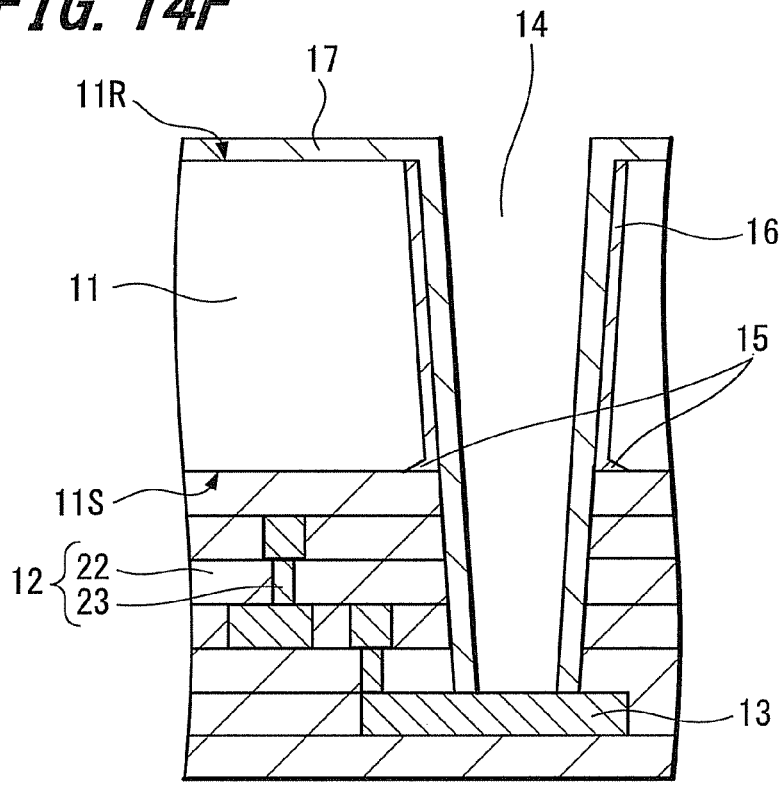
FIGS. 14F and 14G are cross-sectional views illustrating the manufacturing process of the semiconductor apparatus according to an embodiment of the present invention, where

Next, as shown in FIG. 14F, the insulating layer 17 is dry-etched using $CF_4$, $O_2$, or the like to etch-back the insulating layer 17. As a result, the insulating layer 17 is removed from the bottom of the via hole 14, thereby exposing the pad electrode 13.

The etching of the insulating layer 17 is carried out using a difference in coverage in the via hole 14 as described above. Thus, the insulating layer 17 formed at the bottom of the via hole 14 can be etched. At the bottom of the via hole 14, the insulating layer 17 is thinner than other parts thereof formed on the inner surface of the via hole 14 and the backside 11R of the semiconductor substrate 11. Therefore, for example, an anisotropic etching process can be employed to expose the pad electrode 13 from the bottom of the via hole 14 while the insulating layer 17 remaining on each of the backside 11R of the semiconductor substrate 11 and the inner surface of the via hole 14.

Furthermore, in the step which has been described with reference to FIG. 13D, if the insulating layer 16 remaining on each of the backside 11R of the semiconductor substrate 11 and the inner surface of the via hole 14 has a sufficient thickness, it is possible to omit the formation of the insulating layer 17 and the exposure of the pad electrode 13, which have been described with reference to FIG. 13E and FIG. 14F.

Next, a barrier metal (not shown) is formed on each of the backside 11R of the semiconductor substrate 11 and the whole inner surface of the via hole 14 using, for example, a sputtering method, a CVD method, or an atomic layer deposition (ALD) method. The barrier metal may be formed by, for example, making a single layer or a stacked layer of one of Cr, Ti, and Ta or an alloy thereof (e.g., TaN). In addition, the barrier layer may be formed in a thickness sufficient to prevent the metal wiring material such as Cu from dispersing into the insulating layer.

Figure 14G:
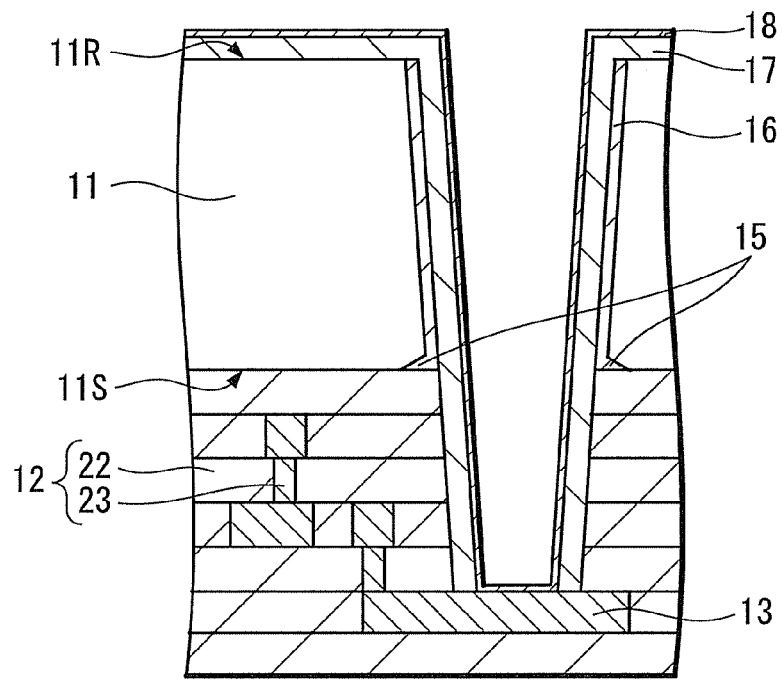

As shown in FIG. 14G, a seed metal 18 made of Cu or the like is formed on the barrier metal using a sputtering method, a CVD method, an ALD method, or a plating method.

Figure 15H:
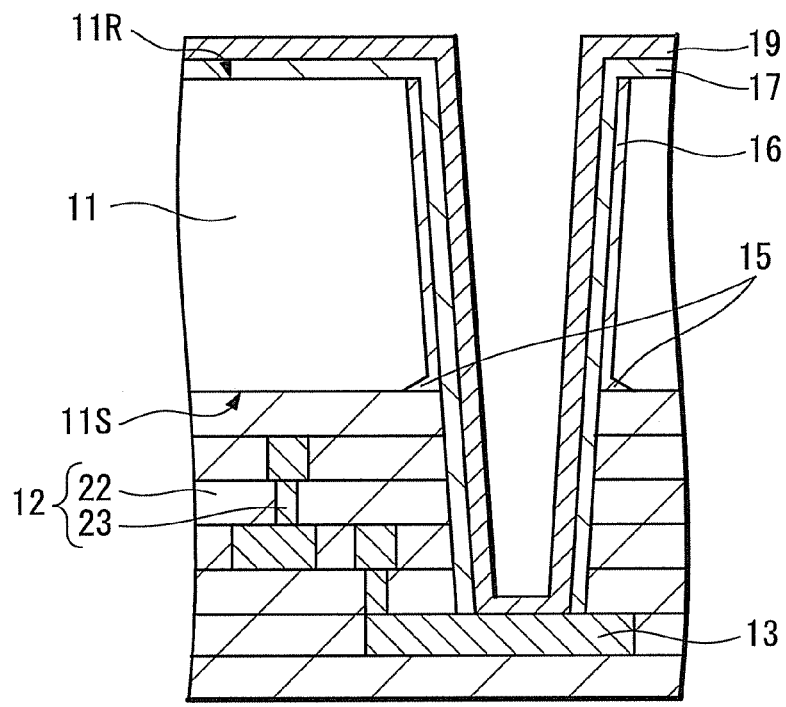
FIGS. 15H and 15I are cross-sectional views illustrating the manufacturing process of the semiconductor apparatus according to an embodiment of the present invention, where

Next, as shown in FIG. 15H, a conductive layer 19 made of Cu or the like is formed by electrolytic plating or the like on the whole surface of the seed metal 18 formed by the step as shown in FIG. 14G. For simplified description, the representation of the seed metal 18 will be omitted in FIG. 15H and the subsequent drawings.

Figure 15I:
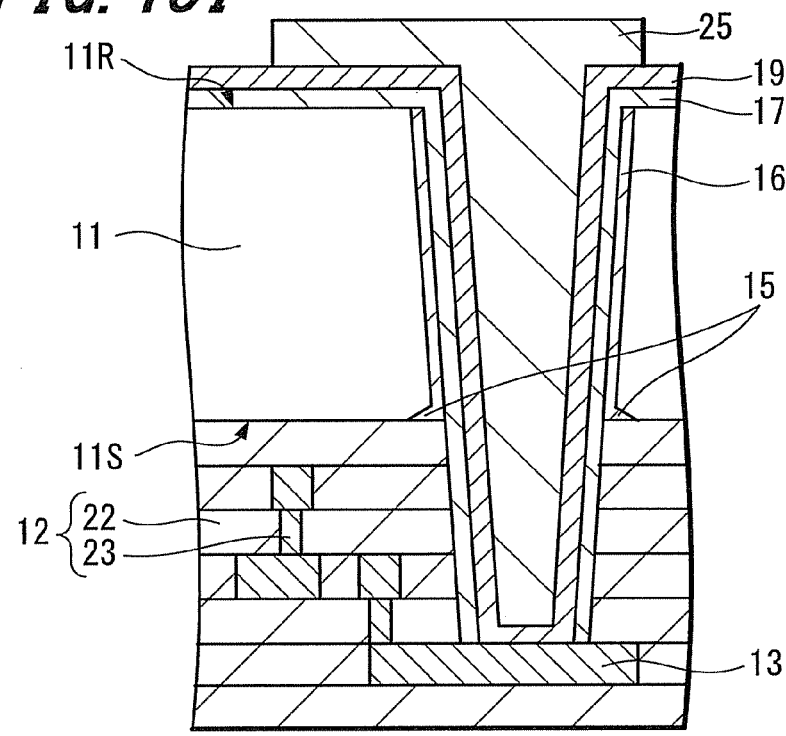
Figure 16J:
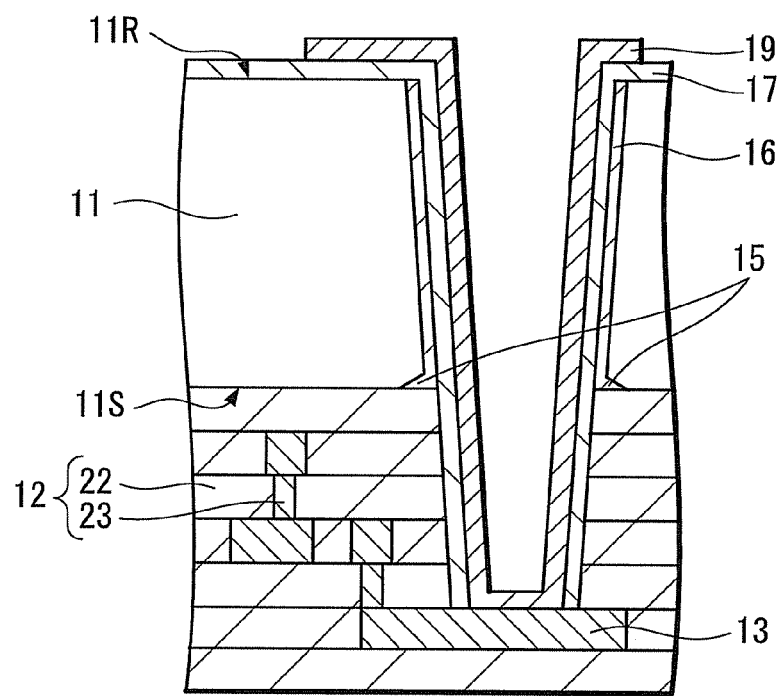
FIGS. 16J and 16K are cross-sectional views illustrating the manufacturing process of the semiconductor apparatus according to an embodiment of the present invention, where

As shown in FIG. 15I, the patterning of a resist 25 is carried out on the backside 11R of the semiconductor substrate 11. Then, as shown in FIG. 16J, the conductive layer 19 is etched using the resist as a mask to remove an excess conductive material. As a result, the conductive layer 19 connecting to the pad electrode 13 can be formed from the backside 11R of the semiconductor substrate 11.

Since the inner surface of the via hole 14 is substantially planarized by the insulating layer 17, the seed metal 18 can be prevented from causing a decrease in coatability, disconnection, and the like. Further, the inner surface of the via hole 14 can be substantially planarized without being affected by the recessed portion 15 formed on the boundary between the semiconductor substrate 11 and the wiring layer 12.

The inner surface of the via hole 14 may be planarized with the insulating layers 16 and 17 to the extent of the follows. The conductive layer 19 formed on the insulating layer 17 can be prevented from receiving an influence of the recessed portion 15 formed on the boundary between the semiconductor substrate 11 and the wiring layer 12. The conductive layer 19 formed on the insulating layer 17 can be prevented from having a convex shape or the like on which stress is concentrated by the thermal expansion or the like of the wiring material.

From the above steps, the semiconductor apparatus can be provided with a through-hole interconnection 26 by forming the conductive layer 19 that is formed through the semiconductor substrate 11 and connects to the pad electrode 13.

Figure 16K:
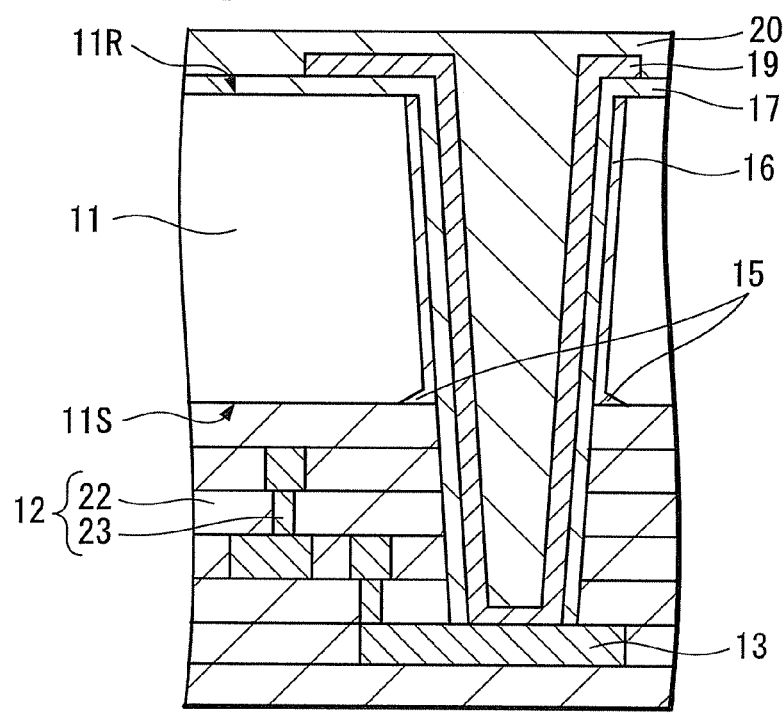

As shown in FIG. 16K, a protective layer 20 is further formed on the entire backside of the semiconductor chip. The protective layer 20 can be formed of a resist or the like using a resin such as a polyimide resin. Furthermore, a photosensitive resin is preferably used for the protective layer 20. Using the photosensitive resin, patterning for the formation of an external terminal or the like can be easily carried out by photolithography.

Subsequently, an external terminal is formed by plating or the like, the semiconductor wafer is cut into pieces by dicing and the like, and a supporting substrate made of glass or the like is connected with an adhesive layer in between, thereby manufacturing the semiconductor apparatus 10 shown in FIG. 9.

The conductive layer 19 can be formed by any of methods other than the above described subtractive method. For example, it may be formed by a semi-additive method.

For example, after the formation of the barrier metal or the seed metal 18 as shown in FIG. 14G, a resist 25 may be formed on a portion where the conductive layer 19 is not formed, as shown in FIG. 17A. The conductive layer 19 is then formed on such a portion by electrolytic plating or the like. Accordingly, the conductive layer 19 can be formed by subjecting only the portion exposed from the resist 25 to the selective electrolytic plating.

Next, as shown in FIG. 17B, the resist 25 is removed. Subsequently, as shown in FIG. 17C, the exposed seed metal and barrier metal are removed by etching. As a result, the conductive layer 19 having the same structure as that of FIG. 16J can be formed.

According to this method, the seed metal and the barrier metal 18 are the only layers to be removed by etching during the formation of the conductive layer 19. Therefore, the thickness of the layer to be etched is small, so that side-etching can be reduced and the metal wiring lines can be fined.

In the above embodiment, the present invention has been applied to the semiconductor apparatus used in a light-receiving element or a light-emitting element, such as a CCD or CMOS image sensor. Alternatively, however, according to an embodiment of the present invention, not only the aforementioned semiconductor apparatus but also any semiconductor apparatus can be provided as long as it includes a through-hole interconnection made in a semiconductor chip. For example, as shown in FIG. 18, according to an embodiment of the present invention, a semiconductor apparatus 40 having a chip-on-chip structure in which two semiconductor chips are mounted face to face can also be provided.

Figure 18:
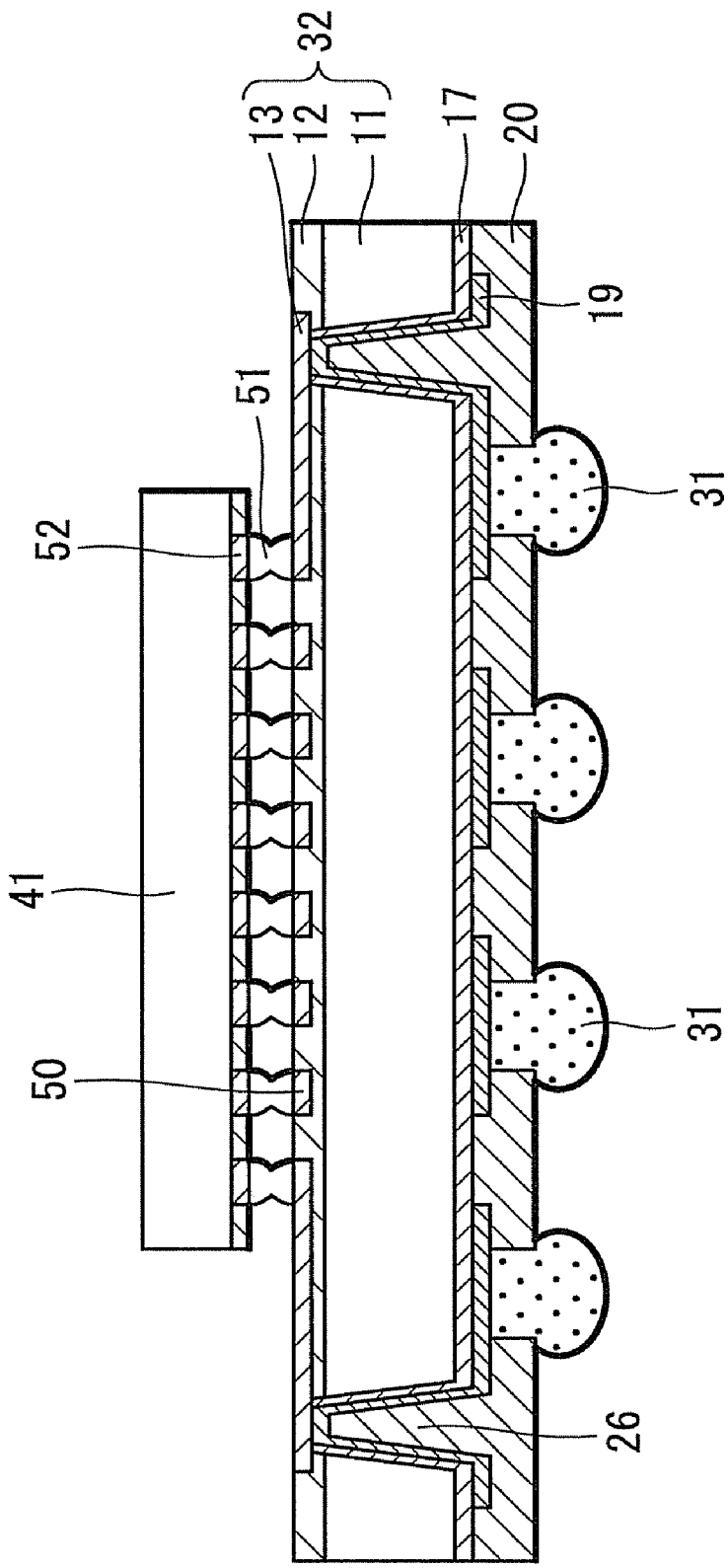
FIG. 18 is a cross-sectional view illustrating a semiconductor apparatus according to another embodiment of the present invention.

As shown in FIG. 18, the same structural elements in the semiconductor apparatus 40 as those of the semiconductor apparatus 10 shown in FIG. 9 are given the same reference numerals and the detailed description thereof will be omitted.

The semiconductor apparatus 40 as shown in FIG. 18 is configured such that one semiconductor chip 41 is mounted on the other semiconductor chip 32 using minute bumps 51. In addition, for example, the semiconductor apparatus 40 is packaged by a mold resin or the like (not shown).

Furthermore, the semiconductor chip 32 includes the same through-hole interconnection 26 as that of the semiconductor apparatus 10 shown in FIG. 9.

The semiconductor chip 41, which is mounted on the semiconductor chip 32, has an electrode 52 on one side thereof. The semiconductor chip 41 is mounted on the semiconductor chip using the bumps 51 made of solder or the like on the electrode 52.

In the semiconductor chip 32, the wiring layer 12 includes a plurality of insulating layers and a plurality of conductive layers stacked on top of one another on the semiconductor substrate 11. In addition, the semiconductor chip 32 has a pad electrode 13 and an electrode 50 on which the bumps 51 for connecting to the semiconductor chip 41 are formed.

In the semiconductor chip 32, the through-hole interconnection 26 for connecting the pad electrode 13 to the conductive layer 19 is formed on the backside of the semiconductor substrate 11. The through-hole interconnection 26 has the same structure as that shown in FIG. 10.

Furthermore, the through-hole interconnection 26 can be formed by the same method as that described in the above with reference to FIGS. 11 to 17.

According to the semiconductor apparatus 40 described above, the same effects as those of the semiconductor apparatus 10 shown in FIG. 9 can be obtained. In addition, according to the semiconductor apparatus 40, the semiconductor apparatus can be small-sized in the case of stacking a plurality of semiconductor chips.

The present invention is not limited to the above configuration and may be configured in various ways without departing from the gist of the invention.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a semiconductor apparatus having a through-hole interconnection, comprising the steps of:
    forming a first insulating layer on a first side of a semiconductor substrate;
    forming a first opening for a via hole that extends through the semiconductor substrate to the first insulating layer by etching the semiconductor substrate from a second side thereof, the step of forming the first opening including etching a portion of the semiconductor substrate defining an edge of the first opening at a boundary interface between the semiconductor substrate and the first insulating layer, thereby forming a recessed portion;
    forming a second insulating layer on an inside of the first opening so that sidewalls of the first opening and a bottom of the first opening are covered with the second insulating layer, the step of forming the second insulating layer including forming the second insulating layer such that the second insulating layer completely fills the recessed portion in the semiconductor substrate so that an inwardly facing surface of the second insulating layer along an entirety of the sidewall of the first opening is planar;
    forming a second opening for the via hole that is in registry with the first opening by etching (i) a portion of the second insulating layer that is formed on the bottom of the first opening and (ii) the first insulating layer formed on the first side of the semiconductor substrate, thereby forming the via hole; and
    forming in the via hole a conductive layer for the through-hole connection.

2. The method of claim 1, further comprising the step of:
    forming a third insulating layer inside the via hole prior to the step of forming the conductive layer.

3. The method of claim 2, wherein the step of forming the conductive layer includes forming the conductive layer on the third insulating layer.

4. The method of claim 1, wherein the step of forming the conductive layer includes forming the conductive layer on the second insulating layer.

* * * * *